(12) United States Patent
Jeong et al.

(10) Patent No.: US 11,994,711 B2
(45) Date of Patent: May 28, 2024

(54) LED MODULE

(71) Applicant: HYUNDAI MOBIS CO., LTD., Seoul (KR)

(72) Inventors: Seok Ho Jeong, Yongin-si (KR); Jung Young Kim, Yongin-si (KR)

(73) Assignee: HYUNDAI MOBIS CO., LTD., Seoul (KR)

( * ) Notice: Subject to any disclaimer, the term of this patent is extended or adjusted under 35 U.S.C. 154(b) by 0 days.

(21) Appl. No.: 17/902,043

(22) Filed: Sep. 2, 2022

(65) Prior Publication Data

US 2023/0204848 A1 Jun. 29, 2023

(30) Foreign Application Priority Data

Dec. 29, 2021 (KR) .................. 10-2021-0191690
Dec. 29, 2021 (KR) .................. 10-2021-0191794

(51) Int. Cl.
| | |
|---|---|
| *F21V 8/00* | (2006.01) |
| *H01L 33/58* | (2010.01) |
| *H01L 33/60* | (2010.01) |
| *H01L 33/62* | (2010.01) |

(52) U.S. Cl.
CPC ........... *G02B 6/0075* (2013.01); *G02B 6/003* (2013.01); *H01L 33/58* (2013.01); *H01L 33/60* (2013.01); *H01L 33/62* (2013.01)

(58) Field of Classification Search
CPC .... G02B 6/0075; G02B 6/003; G02B 6/0038; G02B 6/0016; H01L 33/58; H01L 33/60; H01L 33/62; F21K 9/61; F21V 5/002; F21V 5/02; F21S 41/143; F21S 41/24; F21S 43/261; F21S 43/239; F21S 43/26; B60Q 3/62; F21Y 2115/10

See application file for complete search history.

(56) References Cited

U.S. PATENT DOCUMENTS

| | | | | |
|---|---|---|---|---|
| 7,909,496 | B2 * | 3/2011 | Matheson | G02B 6/0021 362/616 |
| 9,366,396 | B2 * | 6/2016 | Yuan | F21V 29/773 |
| 9,671,099 | B2 * | 6/2017 | Park | F21V 5/045 |
| 10,416,377 | B2 * | 9/2019 | Girotto | F21V 23/0485 |
| 2009/0135623 | A1 * | 5/2009 | Kunimochi | G02B 6/0016 362/608 |
| 2013/0264590 | A1 * | 10/2013 | Oh | F21S 43/15 257/88 |

FOREIGN PATENT DOCUMENTS

CN 108990414 * 12/2018 ........... G02B 6/0095

OTHER PUBLICATIONS

CN 108990414, Dec. 11, 2018, Hennion et al., English Translation (Year: 2018).*

* cited by examiner

*Primary Examiner* — Peggy A Neils
(74) *Attorney, Agent, or Firm* — NovoTechIP International PLLC

(57) ABSTRACT

Disclosed is a LED module. The LED module includes a cover part, a board part connected to a front side of the cover part, a light emitting part electrically connected to the board part, disposed on a front side of the board part, and that emits light through a side surface thereof, and a panel part disposed on the front side of the board part, and the panel part includes a light guide unit including a plurality of light output parts that guides and outputs light emitted from the side surface of the light emitting part.

19 Claims, 43 Drawing Sheets

REARWARD ← → FORWARD

LED MODULE

CROSS-REFERENCE TO RELATED APPLICATIONS

This application claims the benefit of priority to Korean Patent Application No. 10-2021-0191690 and No. 10-2021-0191794, both filed in the Korean Intellectual Property Office on Dec. 29, 2021, the disclosure of which is incorporated herein by reference in their entirety.

TECHNICAL FIELD

The present disclosure relates to an LED module.

BACKGROUND

LED modules are used in various fields, such as lamps for a vehicle. FIG. 1 is a conceptual view illustrating a conventional LED module 1. As illustrated in FIG. 1, the conventional LED module 1 has a problem, in which most of light emitted from an LED 2 travels only to a front side, and thus a structure, such as a reflection plate 3, is necessary to direct the light to a lateral side. Accordingly, a space of 20 mm or more has to be secured, and thus, an entire weight of an LED module may increase. Further, due to the structures, there is a restriction in disposition of the LED module, and it is difficult to implement a free design.

Furthermore, because the conventional LED module directs most of the light only to the front side, a brightness of a portion, at which the light mainly gathers, becomes higher than that of a surrounding portion. FIG. 2 is a conceptual view illustrating a lamp for a vehicle, to which a conventional LED module is applied. As illustrated in FIG. 2, it is difficult to secure a uniformity of a brightness of a lamp L for a vehicle, to which the conventional LED module is applied.

SUMMARY

The present disclosure has been made to solve the above-mentioned problems occurring in the prior art while advantages achieved by the prior art are maintained intact.

An aspect of the present disclosure provides an LED module that has a reduced volume and a reduced weight.

Another aspect of the present disclosure provides an LED module that may secure a uniformity of brightness The technical problems to be solved by the present disclosure are not limited to the aforementioned problems, and any other technical problems not mentioned herein will be clearly understood from the following description by those skilled in the art to which the present disclosure pertains.

An LED module according to an aspect of the present disclosure includes a cover part, a board part connected to a front side of the cover part, a light emitting part electrically connected to the board part, disposed on a front side of the board part, and that emits light through a side surface thereof, and a panel part disposed on the front side of the board part, and the panel part includes a light guide unit including a plurality of light output parts that guides and outputs light emitted from the side surface of the light emitting part.

In another embodiment, the LED module may further include a lens part surrounding the side surface of the light emitting part and disposed on the front side of the board part, and an optic provided with the lens part and having a fine boss shape on an outer surface thereof may be formed in the panel part.

In another embodiment, the optic may further include a second optic formed on a front surface of the panel part to be recessed to the side, and that guides the light emitted from the side surface of the light emitting part toward the front side.

In another embodiment, the first optic and the second optic may have corresponding shapes.

In another embodiment, the first optic may have a shape, a vertical length of which decreases as it goes to a front side.

In another embodiment, a vertical length of the board part may correspond to a vertical length of the cover part.

In another embodiment, a vertical length of the panel part may correspond to the vertical length of the board part.

In another embodiment, the board part may have a white color.

In another embodiment, the LED module may further include an outer lens disposed to be spaced apart from the panel part to the front side.

In another embodiment, a vertical length of the outer lens may correspond to the vertical length of the panel part.

In another embodiment, the LED module may further include an inner lens disposed between the outer lens and the panel part.

In another embodiment, the panel part may include a first recess formed on a rear surface thereof to be recessed in correspondence to a shape of the lens part, and the lens part may be disposed at the first recess.

In another embodiment, the vertical length of the board part may be smaller than the vertical length of the cover part, the panel part may cover the side surface of the board part, and the first optic may include a first area formed on the side surface of the board part, and a second area formed on a front surface of the board part and stepped from the first area.

In another embodiment, the panel part further may include a second recess formed on a rear surface thereof to be recessed in correspondence to a size of the board part, and the board part may be disposed at the second recess.

In another embodiment, the lens part may have a shape obtained by cutting an ellipse into a half along a central axis thereof, when viewed from the side surface thereof.

In another embodiment, the lens part may have a shape, in which a front end of a shape obtained by cutting an ellipse into a half along a central axis thereof is recessed to a rear side, when viewed from the side surface thereof.

In another embodiment, the lens part may have a shape, in which a front end of a shape obtained by cutting an ellipse into a half along a central axis thereof is recessed to a rear side, when viewed from the side surface thereof.

In another embodiment, the pin member may include a head, a pin body that is formed on one side of the head and passes through the panel part, an extension part that extends from the pin body and passes through an assembly hole formed in the cover part, and an assembly boss that protrudes from an outer surface of the extension part and is elastically stopped by the cover part.

In another embodiment, the cover part may include a support plate that supports the board part and the panel part and in which an assembly hole, through which the extension part passes, and the support plate may include a stepped surface formed on a surface that faces the board part and formed at a circumferential area of the assembly hole, and an inclined surface formed at a portion, at which the stepped surface and the assembly hole meet each other, to be inclined.

In another embodiment, a plurality of assembly bosses may be provided to be spaced apart from each other along at least any one of a circumferential direction and an extension direction of the extension part, and the assembly bosses may extend to be inclined toward the head as it goes farther away from an outer surface of the extension part.

In another embodiment, the LED module according to the present disclosure may include a cover part, in which an insertion hole is formed, a board part connected to a front side of the cover part, light emitting part electrically connected to the board part, disposed on a front side of the board part, and that emits light through the side surface, and a panel part disposed on a front side of the board part and assembled with the cover part, and an insertion boss disposed at the insertion hole may be formed in the panel part.

In another embodiment, the cover part may include a support plate that supports the board part and the panel part, and a side wall that extends from a periphery of the support plate toward the panel part, and the insertion boss may be disposed at the insertion hole.

In another embodiment, an extension hole that extends in the insertion hole may be formed in the support plate.

In another embodiment, the cover part may include the support plate that supports the panel part, and the side wall including a stopper hook that extends from a periphery of the support plate toward the panel part, protrudes toward the panel part, and is configured to be elastically deformed by an external force, and the panel part may be coupled to be elastically stopped between the stopper hook and the support plate.

In another embodiment, the LED module may further include an adhesive member attached to a surface of the support plate, which faces the panel part, and a surface of the panel part, which faces the support plate.

In another embodiment, the panel part may include a first light guide unit, and the first light guide unit may include a plurality of light guides that outputs the light emitted from the side surface of the light emitting part to the front side and disposed radially with respect to the light emitting part.

In another embodiment, each of the plurality of light guides may include a light input surface, to which light is input from the light emitting part, and a light output surface, from which the light input to the light input surface is output.

In another embodiment, the light emitting part may include four side surfaces that emit the light, and four light guides may be provided to corresponding to the four side surfaces, respectively.

In another embodiment, a cross-section of each of the light guides, in a direction that is perpendicular to an extension direction thereof, may be circular.

In another embodiment, the panel part may include a second light guide unit, and the second light guide unit may include a body part, to which the light emitted from the side surface of the light emitting part is input, and a plurality of light output parts extending from the body part, that emits the light input to the body part to the front side, and disposed radially with respect to the body part.

In another embodiment, the body part may include a light input surface, to which the light is input from the light emitting part, and each of the plurality of light output parts may include a light output surface from which the light input from the light input surface is output.

In another embodiment, the second light guide unit may further include a deposition surface provided at a corner portion, at which adjacent light output parts meet each other, and on which a material that reflects light is deposited.

In another embodiment, the light input surface may be divided into a plurality of light input parts corresponding to the plurality of light output parts, respectively, and a width of each of the light input parts may decrease as it goes toward an end of a corresponding one of the light output parts.

In another embodiment, the light input surface may include diffusion bosses repeatedly formed along a circumferential direction of the side surface of the light emitting part.

In another embodiment, the light output part may include a reflective surface provided on a surface that is opposite to the light output surface, and that reflects the light input from the light input surface to the light output surface, and a reflective optic having a fine boss shape may be formed on the reflective surface.

In another embodiment, the LED module may include a reflection unit that is disposed on a rear side of the light guide unit and is configured to reflect the light emitted through the side surface of the light emitting part to the front side, and the reflection unit may include a plurality of reflective covers that are separated from each other.

BRIEF DESCRIPTION OF THE DRAWINGS

The above and other objects, features and advantages of the present disclosure will be more apparent from the following detailed description taken in conjunction with the accompanying drawings.

DETAILED DESCRIPTION

Figure 1:
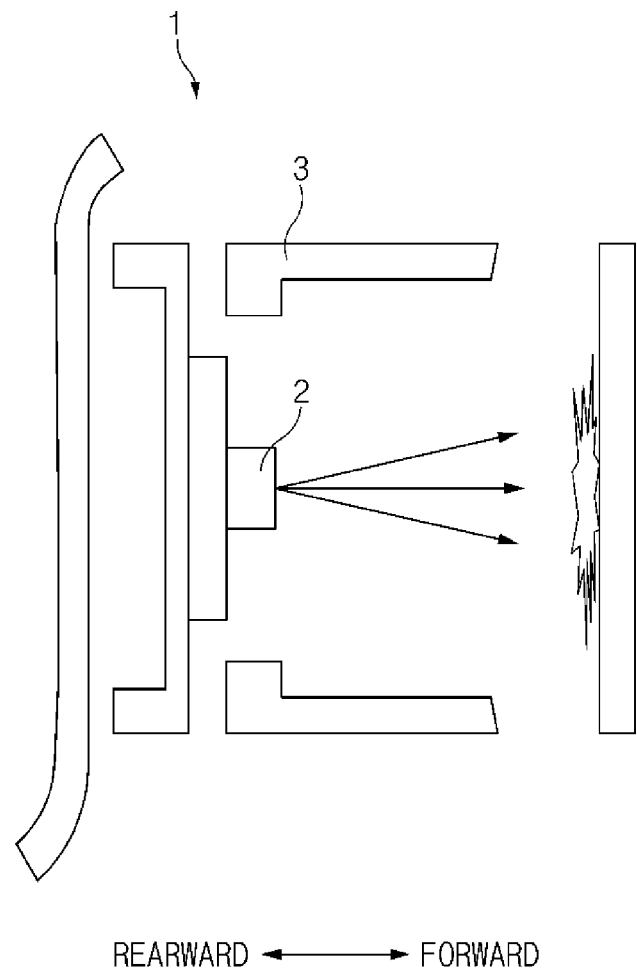
FIG. 1 is a conceptual view illustrating a conventional LED module.

Hereinafter, some embodiments of the present disclosure will be described in detail with reference to the exemplary drawings. In providing reference numerals to the constituent elements of the drawings, the same elements may have the same reference numerals even if they are displayed on different drawings. Further, in the following description of the present disclosure, a detailed description of known functions and configurations incorporated herein will be omitted when it may make the subject matter of the present disclosure rather unclear.

LED Module According to First Embodiment

Figure 3:
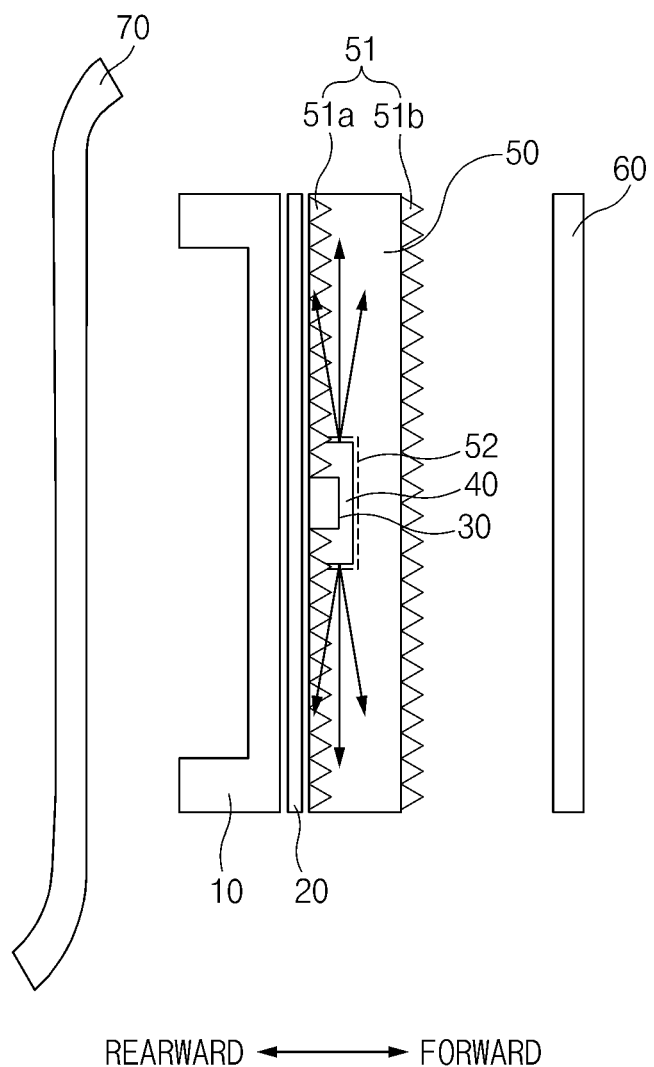
FIG. 3 is a conceptual view illustrating an LED module according to a first embodiment of the present disclosure.

An LED module according to a first embodiment of the present disclosure relates to an LED module that may be applied to a lamp for a vehicle or the like. FIG. 3 is a perspective view illustrating an LED module according to a first embodiment of the present disclosure. Arrows of FIG. 3 may mean paths of light emitted from a light emitting part.

Basic Elements of LED Module According to First Embodiment

As illustrated in FIG. 3, an LED module according to a first embodiment of the present disclosure may include a cover part 10, a board part 20, a light emitting part 30, a lens part 40, and a panel part 50. The board part 20 may be connected to a front side of the cover part 10. The board part 20 may be a general printed circuit board (PCB). The board part 20 may have a white color. Then, when the light emitting part 30, which will be described below, is a white colored LED, a high reflectivity of the board part 20 may be secured, and visibility may become excellent. However, the color of the board part 20 is not limited thereto, and may have various examples according to the color of the light emitting part 30. As an example, when the light emitting part 30 is a red-colored LED, the board part 20 also may be red-colored.

The light emitting part 30 may be electrically connected to the board part 20, and may be disposed on a front side of the board part 20. The light emitting part 30 may be configured to emit light through a side surface thereof. More preferably, the light emitting part 30 may be four side surfaces, and the light emitting part 30 may emit light through the above-described four surfaces.

The lens part 40 may surround the side surfaces of the light emitting part 30, and may be disposed on the front side of the board part 20. Although FIG. 3 illustrates that the lens part 40 has a rectangular cross-section, this is a simple example, and the lens part 40 may have various shapes for forming a uniform light distributing pattern. This will be described in detail later. The lens part 40 may refract the light emitted from the light emitting part 30.

The panel part 50 may have an optic 51 having a fine boss shape on an outer surface thereof. The optic 51 may reflect the light emitted from the light emitting part 30 at various angles. A plurality of optics 51 may be provided. Although FIG. 3 illustrates that a size of the optic 51 is illustrated rather largely, this is for expression, and actually, the optic 51 may have a fine size as compared with the other elements.

The LED module according to the first embodiment of the present disclosure may further include an outer lens 60. The outer lens 60 may be disposed to be spaced apart from the panel part 50 to a front side. The outer lens 60 may function as a cover for protecting internal configurations of the LED module according to the present disclosure from an outside.

Furthermore, the LED module according to the first embodiment of the present disclosure may further include a housing 70. The housing 70 may be disposed on a rear side of the cover part 10. The housing 70 may function to protect the LED module by surrounding the LED module on a rear side thereof.

That is, when the elements are listed in a sequence from the rear side to the front side, the sequence may be the housing 70, the cover part 10, the board part 20, the light emitting part 30, the lens part 40, the panel part 50, and the outer lens 60.

According to the present disclosure, because a uniform turning-on image may be implemented while an additional space is not secured in an entire area of the light emitting part 30 to diffuse light because the light is emitted through the side surfaces of the light emitting part 30, a volume occupied by the LED module may be significantly reduced.

Furthermore, according to the present disclosure, because the light may be emitted from the side surfaces of the light emitting part 30 and the plurality of fine optics 51 reflect the light at various angles at different locations, a uniformity of brightness may be secured.

Figure 4:
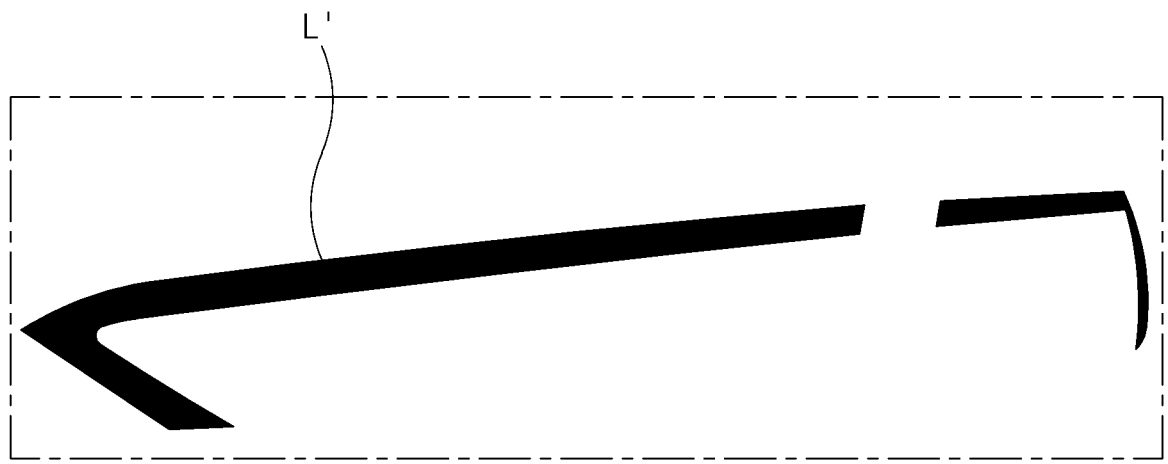
FIG. 4 is a conceptual view illustrating a lamp for a vehicle, to which an LED module according to a first embodiment of the present disclosure is applied.

FIG. 4 is a conceptual view illustrating a lamp for a vehicle, to which the LED module according to the first embodiment of the present disclosure is applied. Because the LED module according to the first embodiment of the present disclosure may reflect light at various angles, a uniformity of the brightness of the lamp L' may be secured as in FIG. 4 when the LED module according to the first embodiment of the present disclosure is applied to a lamp.

Furthermore, because the LED module according to the first embodiment of the present disclosure may secure a uniformity of brightness, the number of light sources that has to be disposed in the lamp for a vehicle may be reduced.

First Optic 51a and Second Optic 51b

The optic 51 may include a first optic 51a. The first optic 51a may be provided on a rear surface of the panel part 50 and may be recessed toward the front side. The first optic 51a may be configured to reflect the light emitted from the side surface of the light emitting part 30 such that the light is guided toward the front side. The first optic 51a may mean not only one fine boss shape but also several sets.

As an example, the first optic 51a may have a shape, of which a vertical length decreases as it goes to the front side. For example, the first optic 51a may have a shape obtained by cutting an ellipse along the y axis. Alternatively, the first optic 51a may have a triangular shape, in which a line that is parallel to the y axis is one edge. However, the present disclosure is not limited thereto, and the shape of the first optic 51a may have various examples.

Furthermore, the optic 51 may include a second optic 51b. The second optic 51b may be provided on a front surface of the panel part 50 and may protrude toward the front side. The second optic 51b may be configured to diffuse the light emitted from the side surface of the light emitting part 30 such that the light is guided toward the front side. The second optic 51b also may mean not only one fine boss shape but also several sets. Furthermore, of course, the second optic 51b also may have various shapes of the above-described first optic 51a.

The second optic 51b may have a shape corresponding to that of the first optic 51a. However, here, the corresponding shapes do not necessarily mean the same shape, but may mean similar arrangements under a specific rule.

For example, when a triangular shape and a ladder shape of the first optic 51a are alternately arranged, a ladder shape and a triangular shape of the second optic 51b may be alternately arranged.

Figure 5:
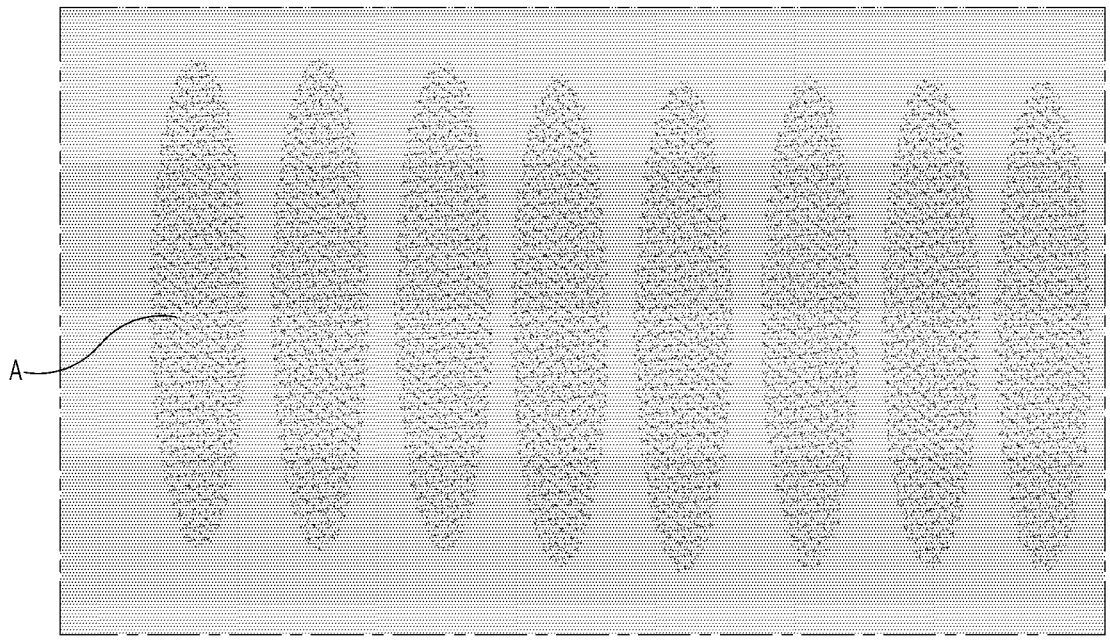
FIG. 5 is a conceptual view of a light emission pattern when shapes of a first optic and a second optic are triangular.
Figure 6:
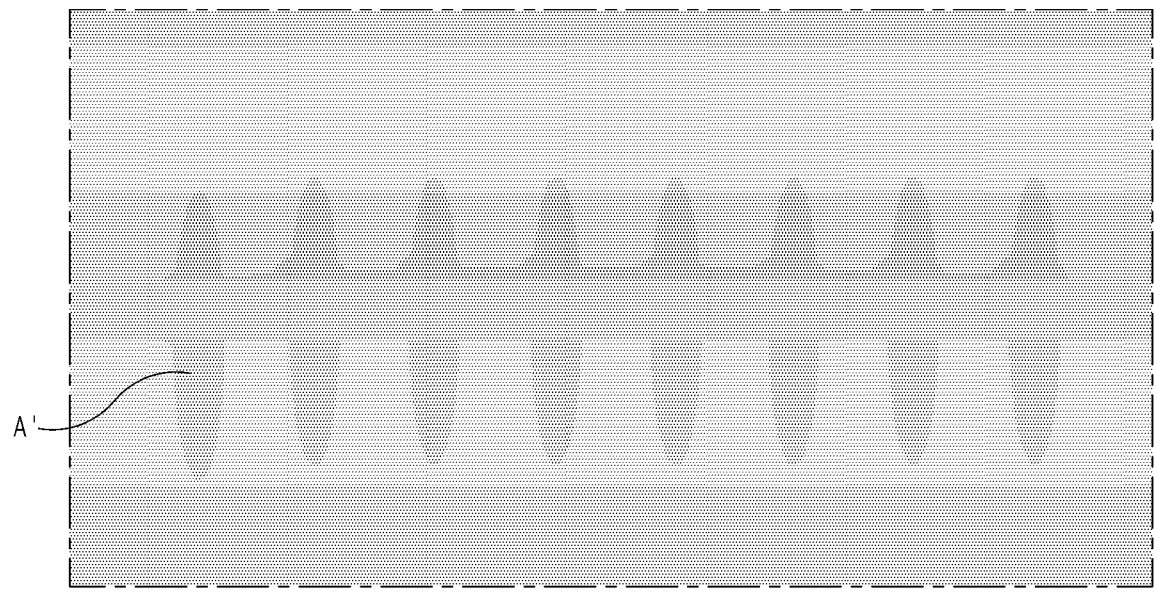
FIG. 6 is a conceptual view of a light emission pattern when shapes of a first optic and a second optic are elliptical.

FIG. 5 is a conceptual view illustrating a light emission pattern when shapes of the first optic 51a and the second optic 51b are triangular. FIG. 6 is a conceptual view illustrating a light emission pattern when shapes of the first optic 51a and the second optic 51b are elliptical. As illustrated in FIGS. 5 and 6, shapes of light emitting areas A and A' may be different according to the shape of the optic 51. Accordingly, an operator may form the shapes of the first optic 51a and the second optic 51b differently according to a light emission pattern that is to be formed.

Relationship of Sizes of Elements

Meanwhile, a vertical length of the board part 20 may correspond to a vertical length of the cover part 10. Furthermore, a vertical length of the panel part 50 may correspond to a vertical length of the board part 20. Accordingly, a vertical length of the panel part 50 may correspond to a vertical length of the cover part 10.

Furthermore, a vertical length of the outer lens 60 may correspond to the vertical length of the panel part 50. Accordingly, the vertical length of the outer lens 60 may correspond to the vertical lengths of the board part 20 and the cover part 10.

Detailed Shape of Panel Part 50

The panel part 50 may include a first recess 52. The first recess 52 may be formed on (or disposed at) a rear surface of the panel part 50 to be recessed in correspondence to a size of the lens part 40. Here the correspondence does not necessarily mean coincidence, but may include a meaning of a space, into which the lens part 40 may be inserted, or more. For example, the first recess 52 may be formed such that a portion that protrudes from the panel part 50 is not present when the lens part 40 is inserted into and disposed at the first recess 52.

Figure 2:
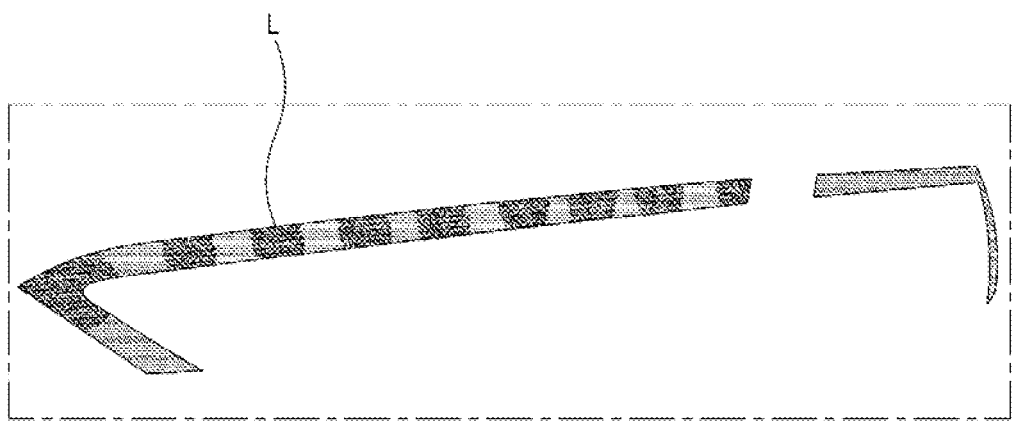
FIG. 2 is a conceptual view illustrating a lamp for a vehicle, to which a conventional LED module is applied.

As an example, as illustrated in FIG. 2, a shape of the lens part 40 including the first recess 52 may be a shape obtained by rotating a U shape by 90 degrees.

The lens part 40 may be inserted into and disposed at the first recess 52. Because the first recess 52 is formed to correspond to the size of the lens part 40, a portion that protrudes from the panel part 50 is not present when the lens part 40 is inserted into and disposed at the first recess 52.

Figure 7:
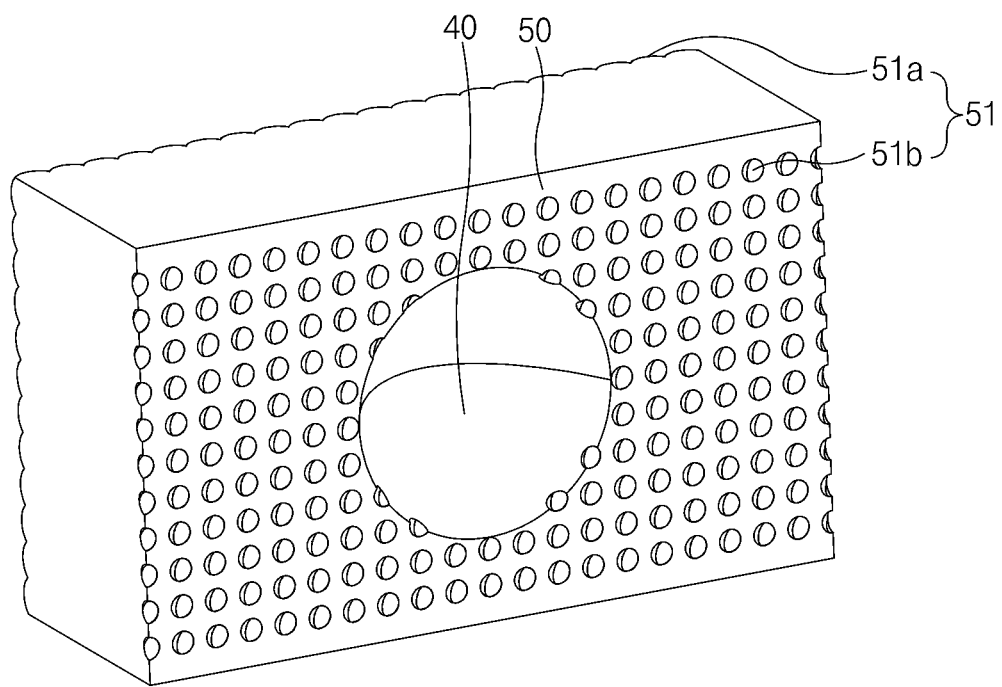
FIG. 7 is a view illustrating an example of a shape of a lens part.
Figure 8:
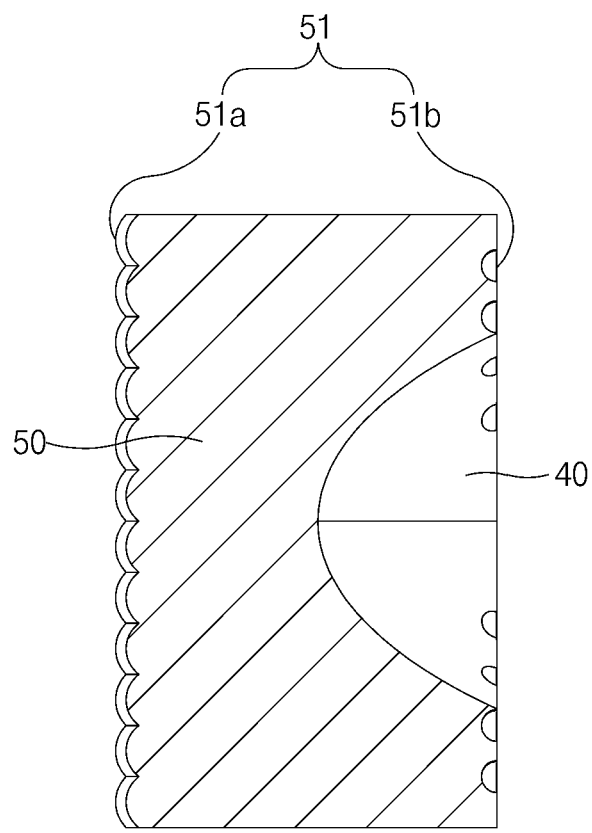
FIG. 8 is a cross-sectional view of FIG. 7.
Figure 9:
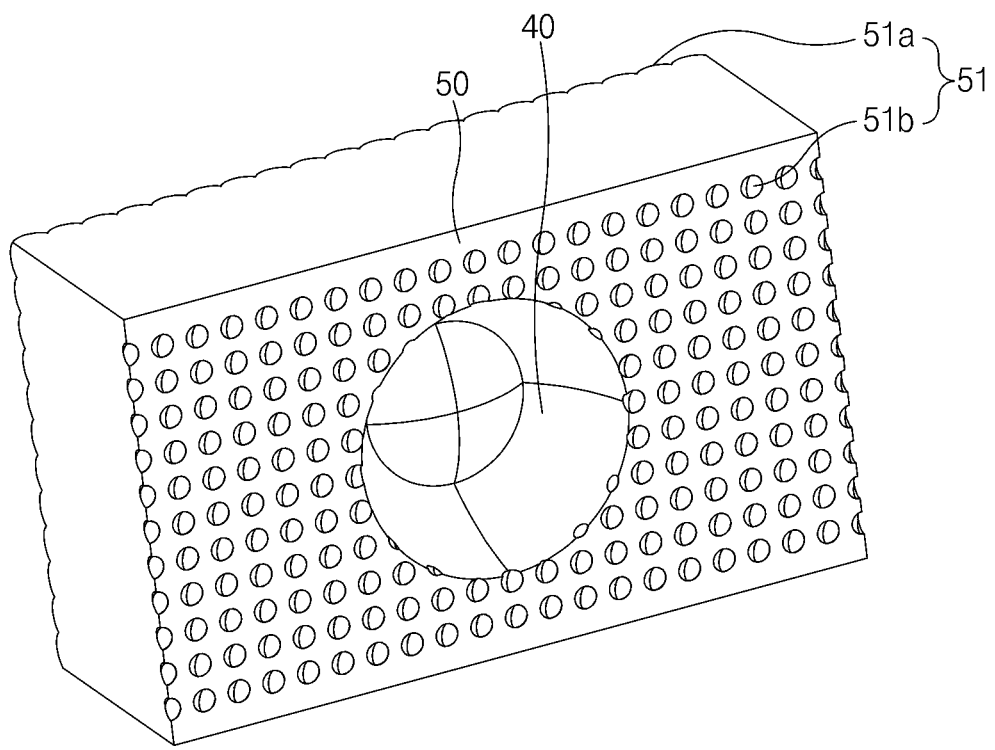
FIG. 9 is a view illustrating another example of a shape of a lens part.
Figure 10:
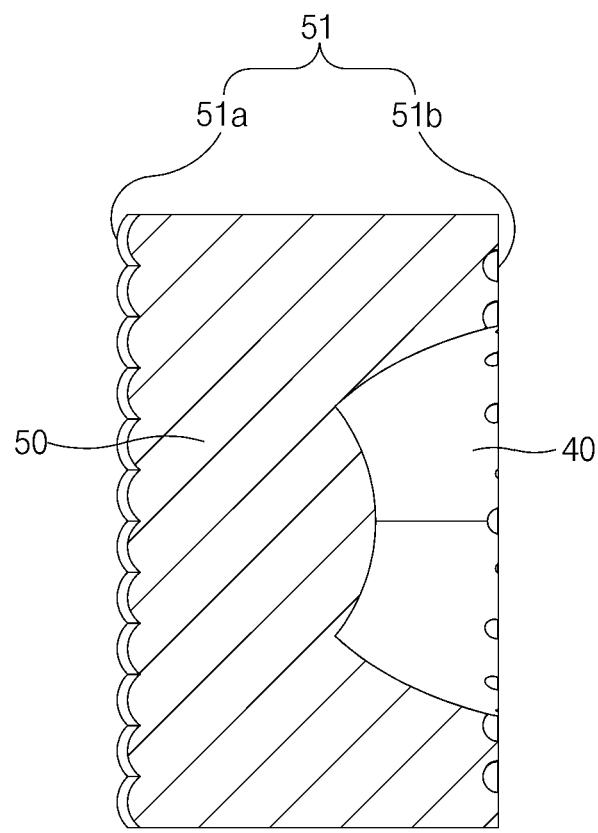
FIG. 10 is a cross-sectional view of FIG. 9.
Figure 11:
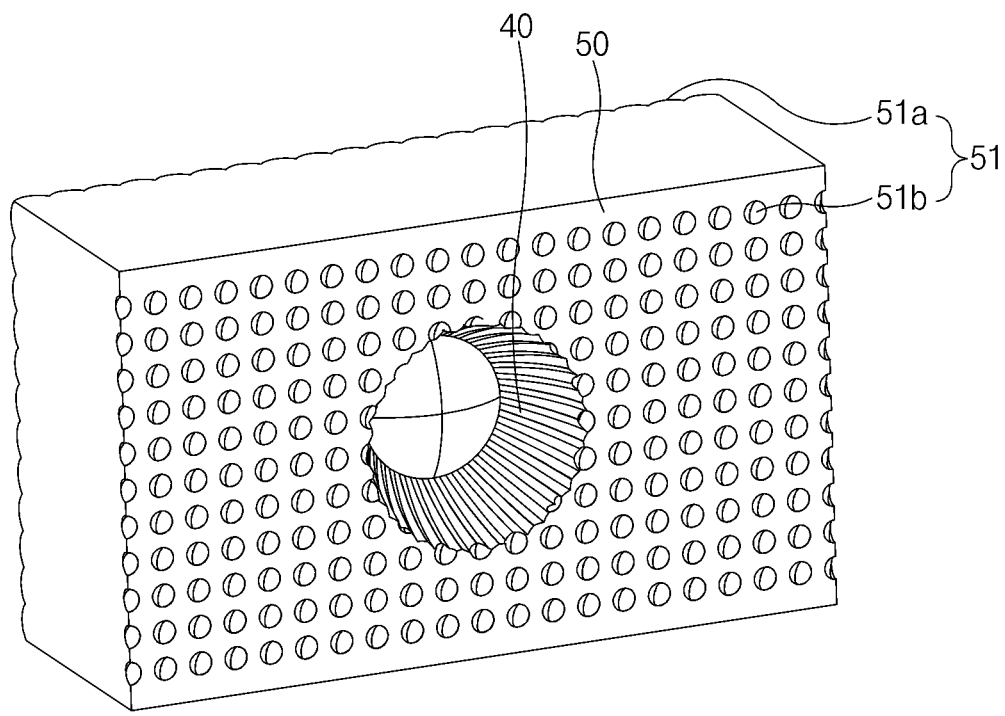
FIG. 11 is a view illustrating another example of a shape of a lens part.
Figure 12:
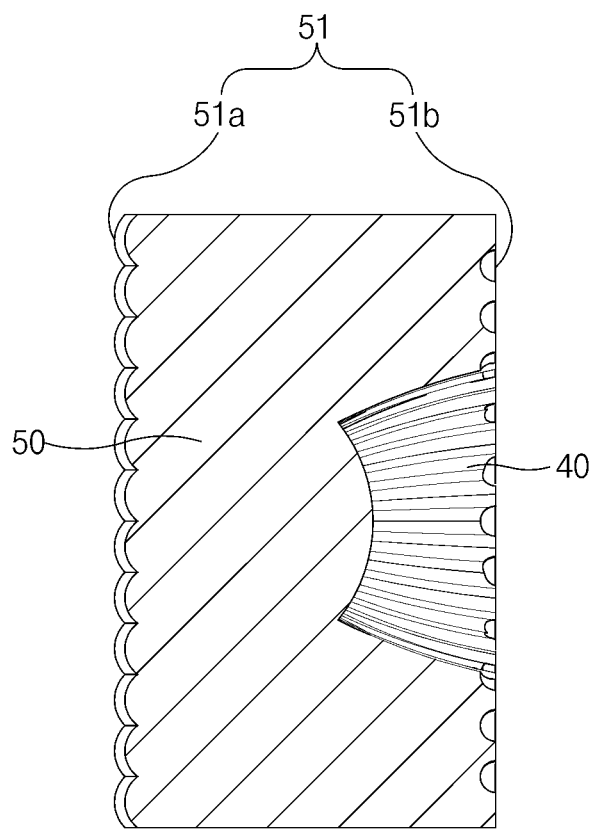
FIG. 12 is a cross-sectional view of FIG. 11.
Figure 13:
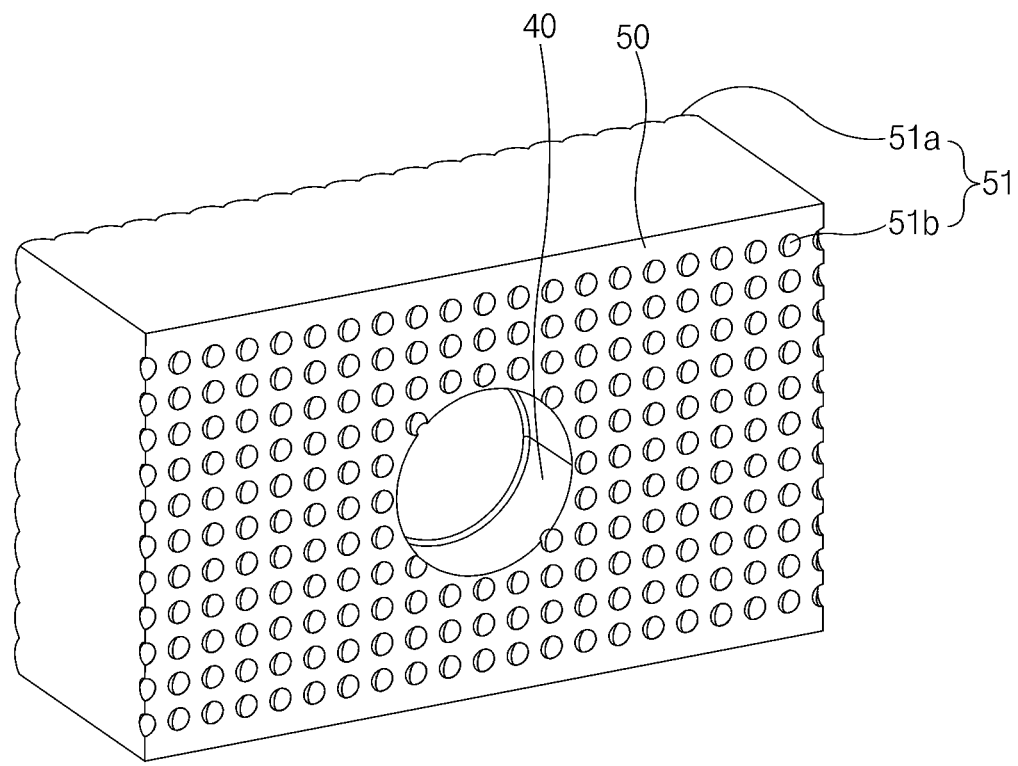
FIG. 13 is a view illustrating another example of a shape of a lens part.
Figure 14:
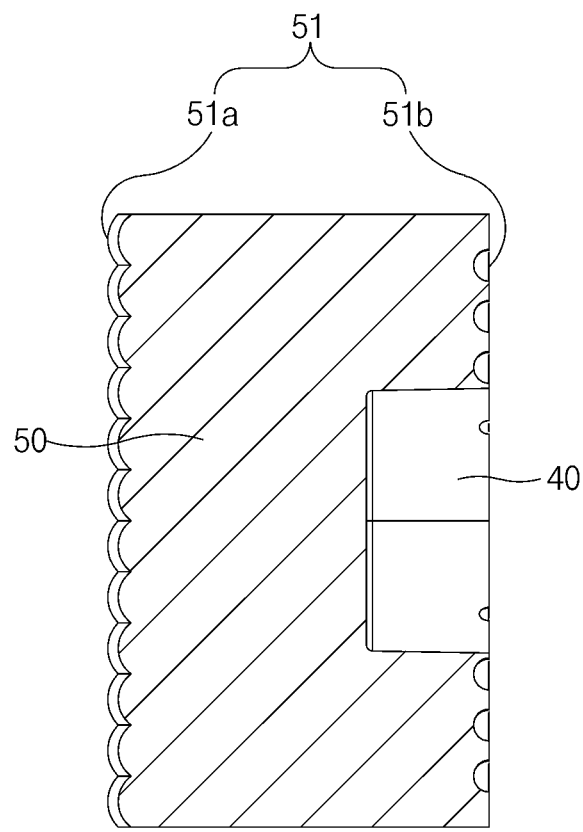
FIG. 14 is a cross-sectional view of FIG. 13.
Figure 15:
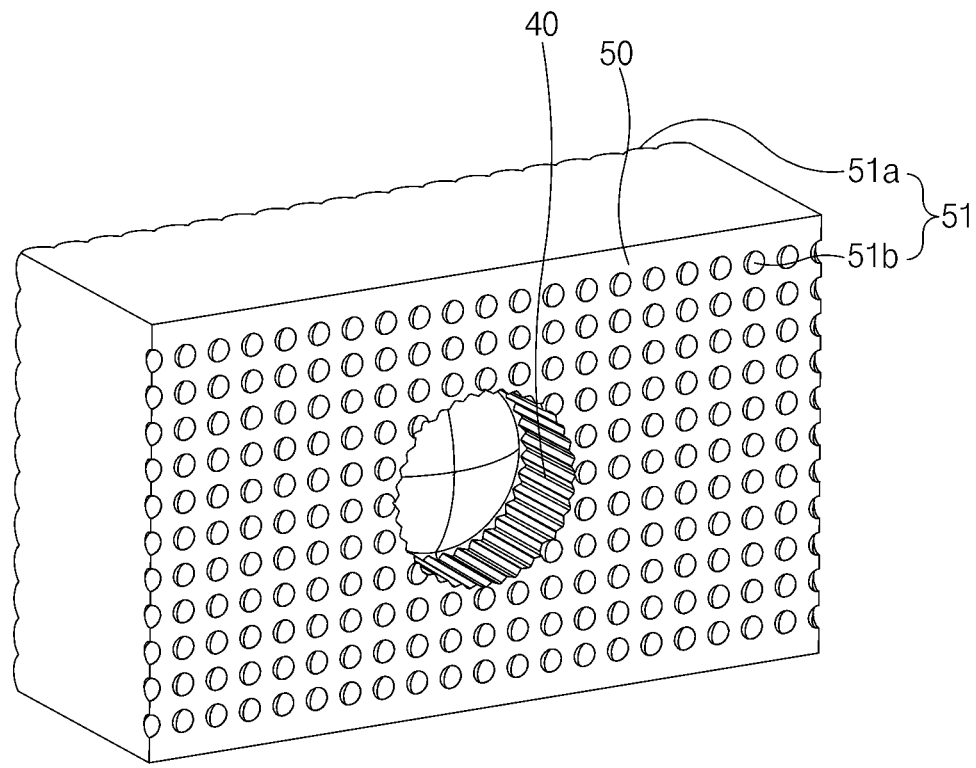
FIG. 15 is a view illustrating another example of a shape of a lens part.
Figure 16:
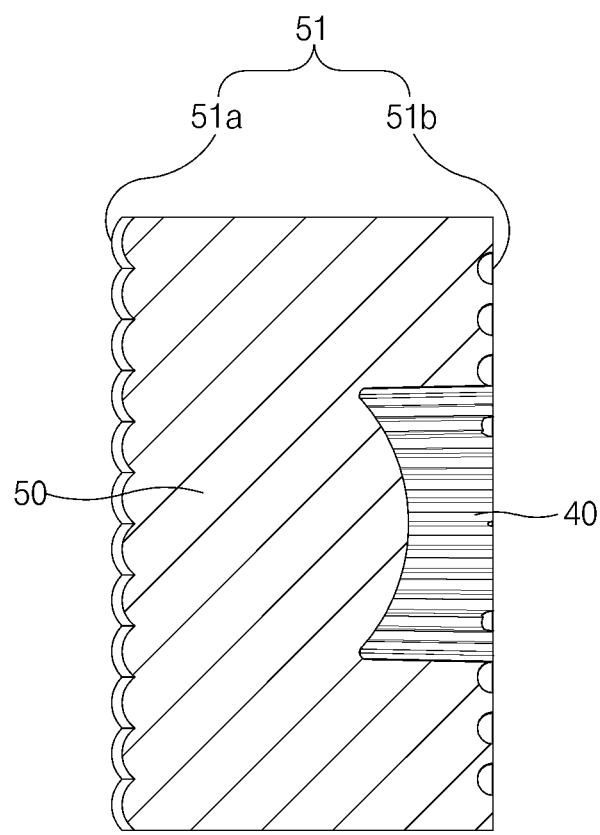
FIG. 16 is a cross-sectional view of FIG. 15.
Figure 17:
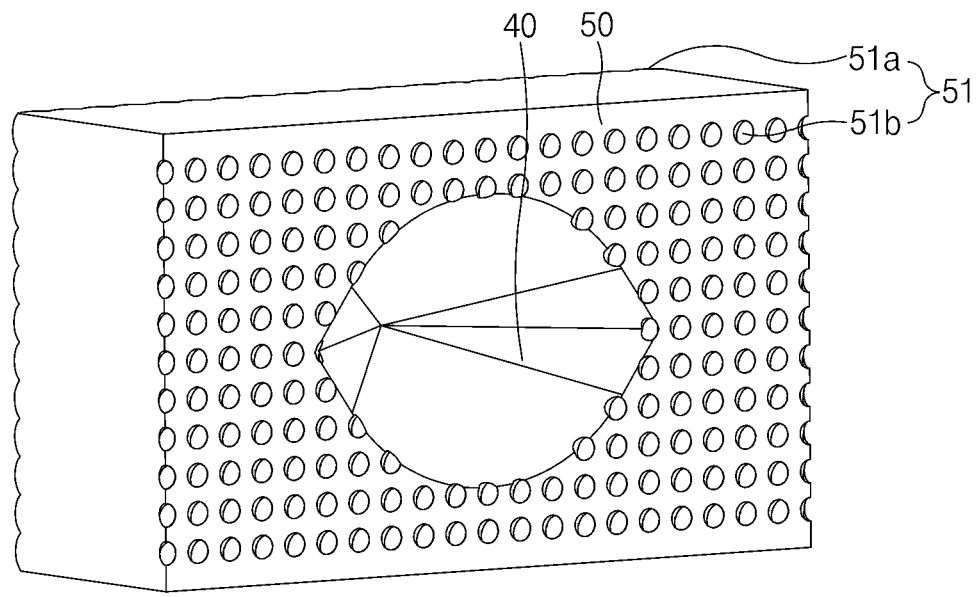
FIG. 17 is a view illustrating another example of a shape of a lens part.
Figure 18:
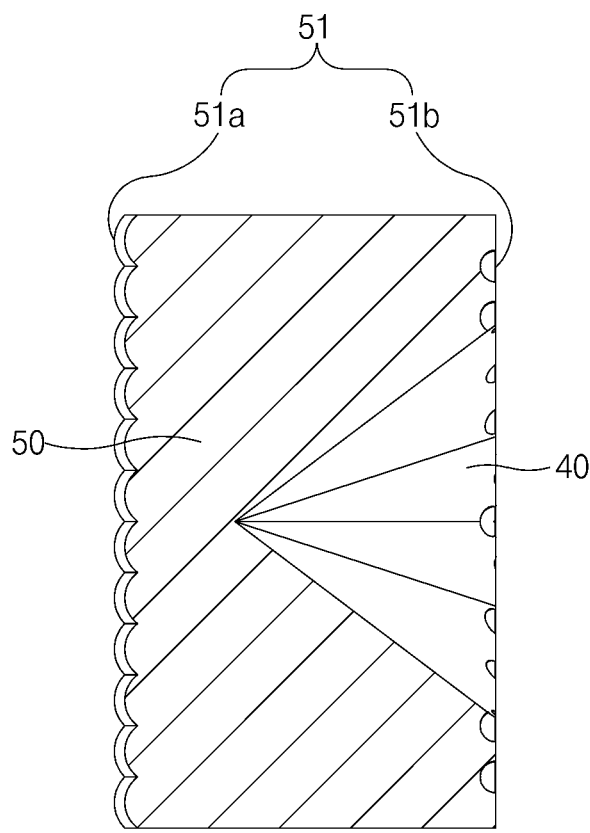
FIG. 18 is a cross-sectional view of FIG. 17.
Figure 19:
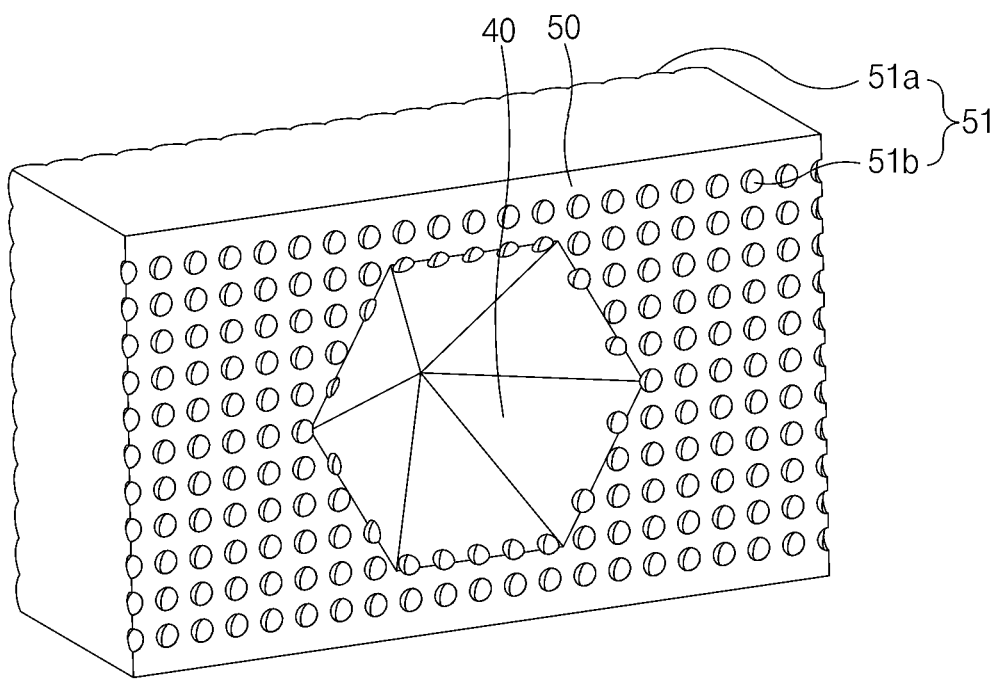
FIG. 19 is a view illustrating another example of a shape of a lens part.
Figure 20:
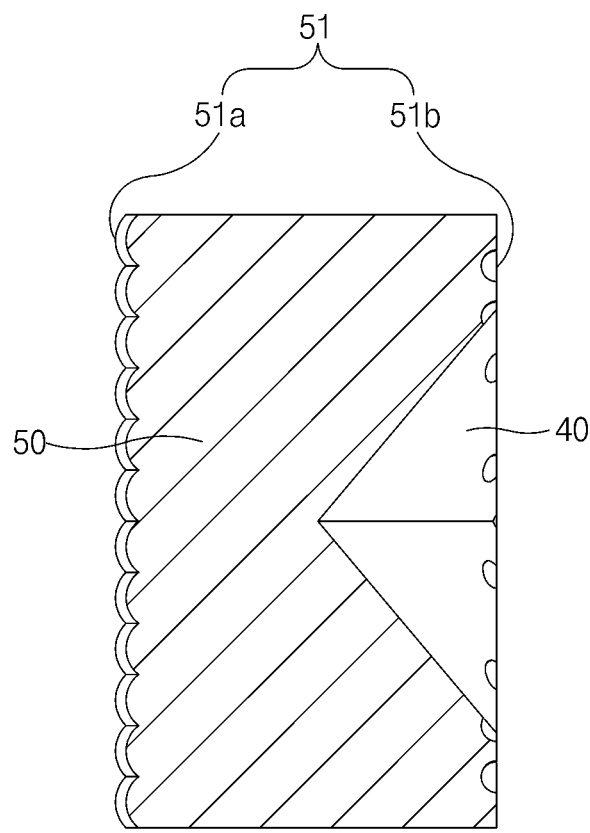
FIG. 20 is a cross-sectional view of FIG. 19.
Figure 21:
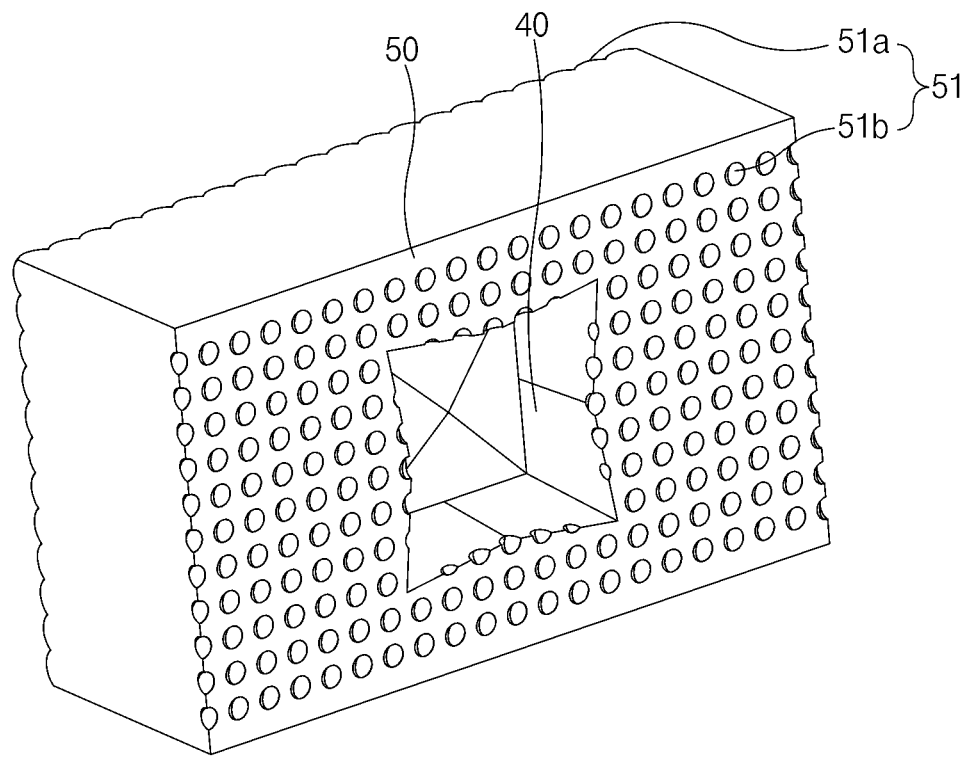
FIG. 21 is a view illustrating another example of a shape of a lens part.
Figure 22:
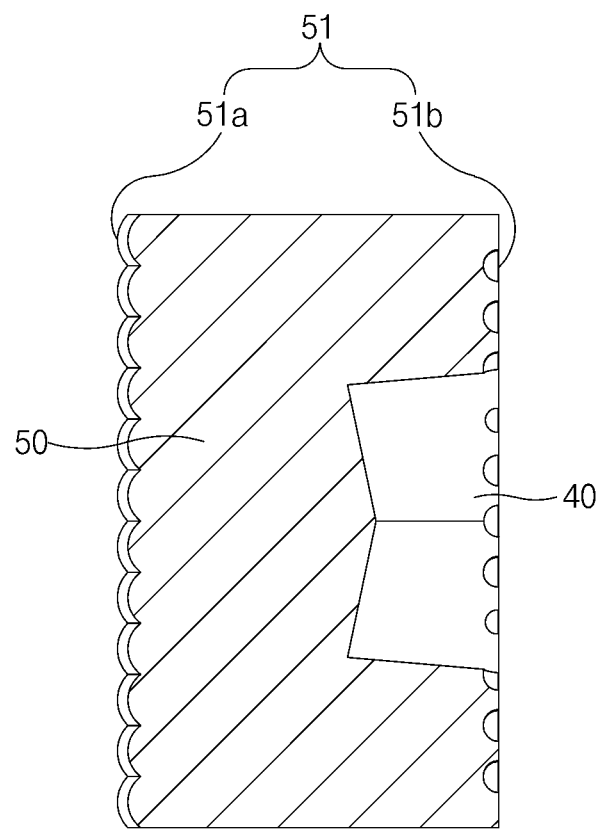
FIG. 22 is a cross-sectional view of FIG. 21.

Meanwhile, the shape of the lens part 40 may be variously formed. FIG. 7 is a view illustrating an example of a shape of the lens part. FIG. 8 is a cross-sectional view of FIG. 7. FIG. 9 is a view illustrating another example of a shape of the lens part. FIG. 10 is a cross-sectional view of FIG. 8. Hereinafter, examples of the shape of the lens part will be described below with reference to FIGS. 7 to 10.

As an example, as illustrated in FIGS. 7 and 8, the lens part 40 may have a shape obtained by cutting an ellipse into a half along a central axis thereof when viewed from a side surface thereof.

As another example, as illustrated in FIGS. 9 and 10, the lens part 40 may have a shape, in which a front end of a shape obtained by cutting an ellipse into a half along a central axis thereof when viewed from a side surface thereof is recessed to a rear side. When the lens part 40 has the shapes illustrated in FIGS. 9 and 10, it is advantageous in removing a hot spot and a high light uniformity may be secured.

However, FIGS. 7 to 10 are simple examples of the shape of the lens part, and may be variously modified according to a necessity of a general technician. FIGS. 11, 13, 15, 17, 19, and 21 are views illustrating other examples of a lens shape of a lens part. FIGS. 12, 14, 16, 18, 20, and 22 are cross-sectional views of FIGS. 11, 13, 15, 17, 19, and 21. FIGS. 11 to 22 are views illustrating various modifiable examples of the lens part.

For example, a serration shape may be added to the lens part 40. Alternatively, the lens part 40 may have a cylindrical shape or may have a shape, in which a front end of a cylindrical shape is concave to the rear side.

Because refraction of the light emitted from the light emitting part 30 may become different as the shape of the lens part 40 is formed variously, a light path of the light emitting part 30 may be formed variously, and thus targets, such as removal of a hot spot or securing of light uniformity, may be achieved when a product is produced.

Meanwhile a forward/rearward length of the panel part 50 with respect to a portion of the panel part 50 of the LED module according to the first embodiment, at which the first recess 52 is not formed, is preferably 7 mm, but the present disclosure is not limited thereto, and may be variously modified in a range that is obtained by an ordinary person in the art.

LED Module According to Second Embodiment

Figure 23:
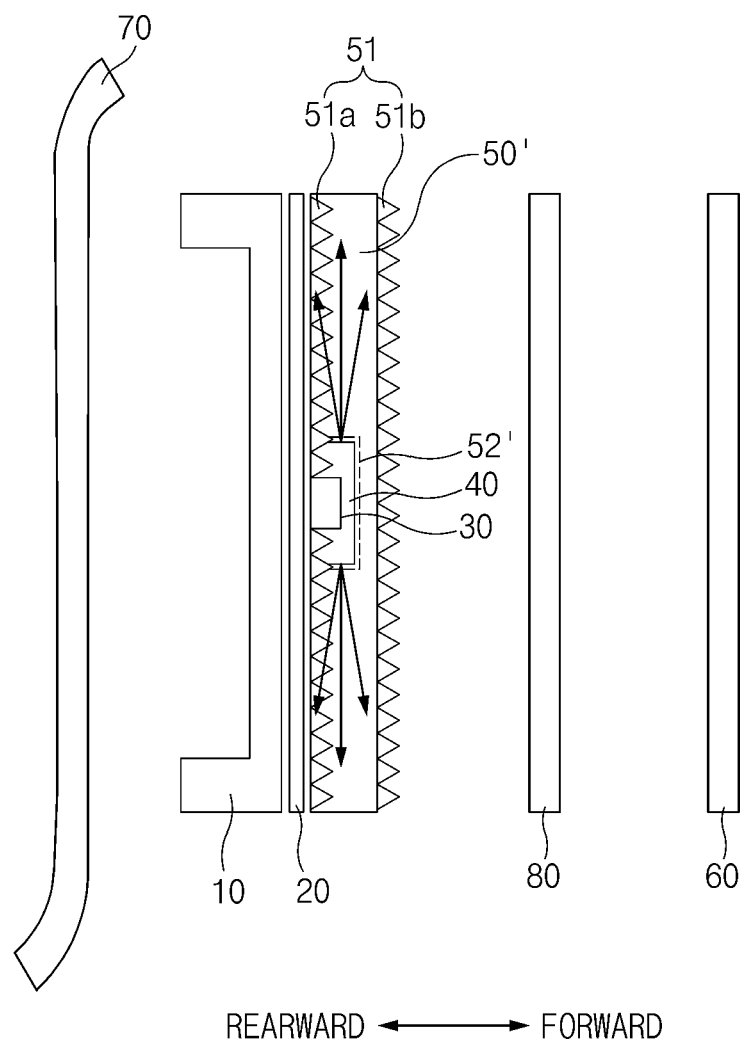
FIG. 23 is a conceptual view illustrating an LED module according to a second embodiment of the present disclosure.

FIG. 23 is a conceptual view illustrating an LED module according to a second embodiment of the present disclosure. A LED module according to a second embodiment of the present disclosure will be described with reference to FIGS. 23 and 1 to 22.

The LED module according to the second embodiment of the present disclosure is different from the LED module according to the first embodiment in presence of an inner lens 80 and a thickness of the panel part 50. The same or corresponding reference numerals are given to configurations that are the same as or correspond to those of the LED module according to the first embodiment, and a detailed description thereof will be omitted.

As illustrated in FIG. 23, the LED module according to the second embodiment of the present disclosure may further include the inner lens 80. The inner lens 80 may be disposed between the outer lens 60 and a panel part 50'.

Meanwhile, a vertical length of the inner lens 80 may correspond to the vertical length of the outer lens 60. Accordingly, the vertical length of the inner lens 80 may correspond to the vertical lengths of the panel part 50', the board part 20, and the cover part 10.

Meanwhile a forward/rearward length of the panel part 50 with respect to a portion of the panel part 50' of the LED module according to the second embodiment, at which a first recess 52' is not formed, is preferably 2.5 mm, but the present disclosure is not limited thereto, and may be variously modified in a range that is obtained by an ordinary person in the art.

Meanwhile, of course, as a forward/rearward length of the panel part 50' is changed, a relative size of a space occupied by the first recess 52' also may be changed.

LED Module According to Third Embodiment

Figure 24:
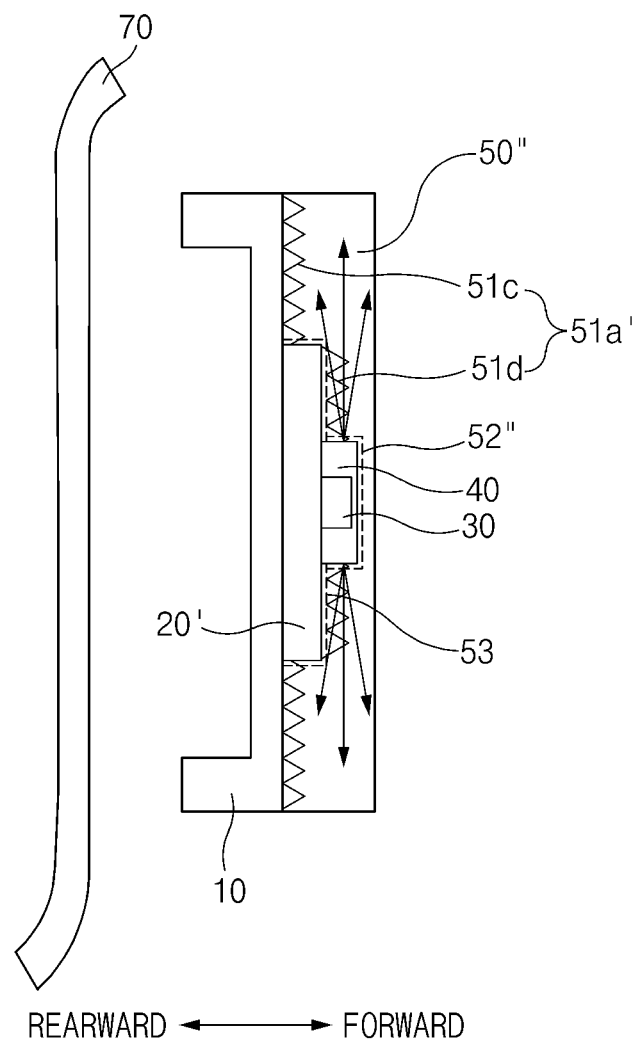
FIG. 24 is a conceptual view illustrating an LED module according to a third embodiment of the present disclosure.

FIG. 24 is a conceptual view illustrating an LED module according to a third embodiment of the present disclosure. Hereinafter, the LED module according to the third embodiment of the present disclosure will be described with reference to FIGS. 24 and 1 to 22.

The LED module according to a third embodiment of the present disclosure is different from the LED module according to the first embodiment in a shape of a panel part 50" and a first optic 51a'. The same or corresponding reference numerals are given to configurations that are the same as or correspond to those of the LED module according to the first embodiment, and a detailed description thereof will be omitted.

a vertical length of a board part 20' of the LED module according to the third embodiment of the present disclosure may be smaller than a vertical length of the cover part 10. Then, the panel part 50" may be formed to cover a side surface of the board part 20'.

As an example, the panel part 50" may include a second recess 53, into which the board part 20' is inserted. The second recess 53 may be communicated with a first recess 52", and the vertical length of the second recess 53 may be larger than the vertical length of the first recess 52". Then, the panel part 50" may be formed to be adjacent to the cover part 10. Furthermore, accordingly, the first recess 52" of the LED module according to the third embodiment may be displaced toward the center of the panel part 50" as compared with the first recess 52 according to the first embodiment.

As illustrated in FIG. 24, a first optic 51a' may include a first area 51c and a second area 51d. The first area 51c may be formed on a side surface of the board part 20. The second area 51d may be formed on a front surface of the board part 20. The second area 51d may be stepped from the first area 51c.

LED Module According to Fourth Embodiment

Figure 25:
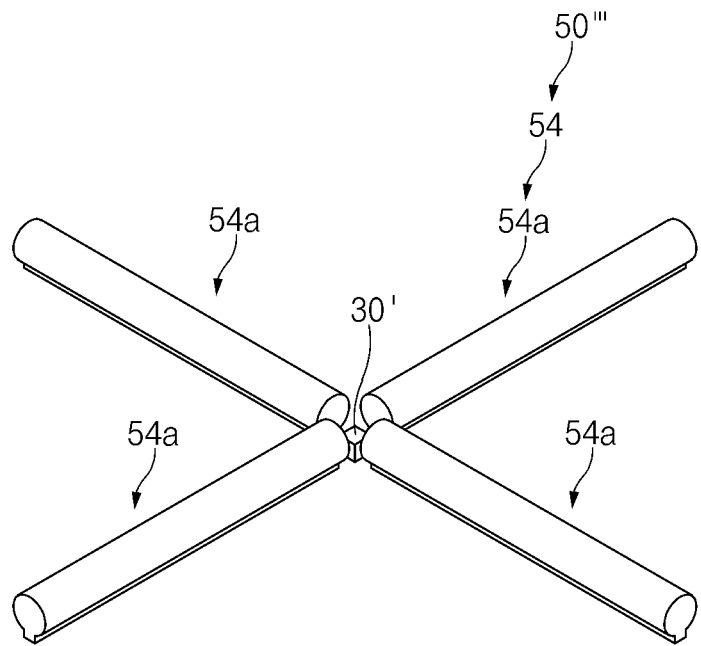
FIG. 25 is a perspective view illustrating an LED module according to a fourth embodiment of the present disclosure.
Figure 26:
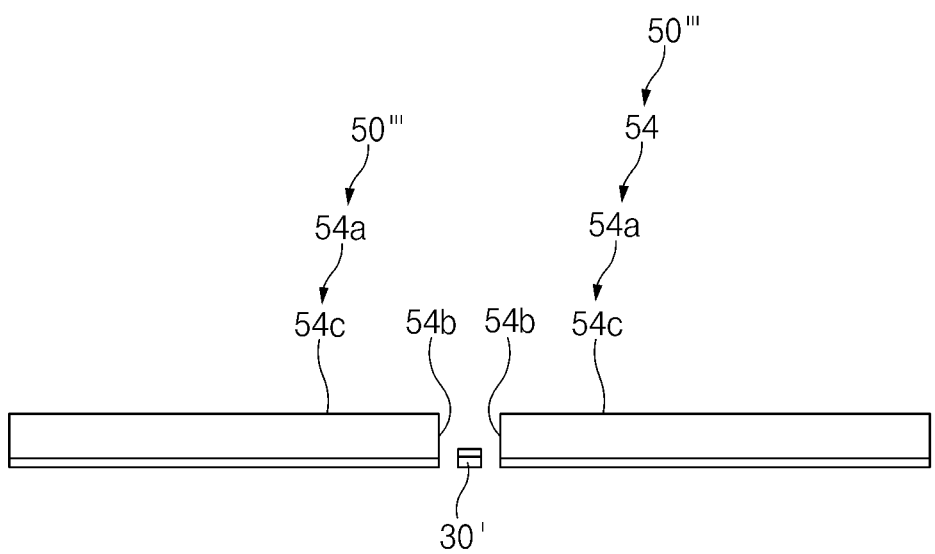
FIG. 26 is a side view illustrating a side surface of FIG. 25.

FIGS. 25 and 26 illustrate an LED module according to a fourth embodiment of the present disclosure. FIG. 25 is a perspective view illustrating the LED module according to the fourth embodiment of the present disclosure. FIG. 26 is a side view illustrating a side surface of FIG. 25.

The LED module according to the fourth embodiment of the present disclosure is different from that of the first embodiment in a panel part 50'''. Accordingly, the fourth embodiment of the present disclosure may include all the configurations of the first embodiment, except for the above-described differences. Hereinafter, the same reference numerals will be used for the same elements, and a repeated description thereof will be omitted.

Referring to FIGS. 25 and 26, the panel part 50''' according to the fourth embodiment of the present disclosure may include a light guide unit.

The light guide unit may include a plurality of light output parts 57 that guide and output light emitted from the side surface of a light emitting part 30'. The light guide unit may function to provide a path, along which the light emitted from the side surface of the light emitting part 30' is uniformly scattered and diffused. The shape and configuration of the light guide unit are not limited as long as the light guide unit may guide the light emitted from the side surface of the light emitting part 30' and output the light to the front side, and for example, the light guide unit may be implemented by a first light guide unit 54.

The panel part 50''' may include the first light guide unit 54.

The first light guide unit 54 may include a plurality of light guides 54a, and the plurality of light guides 54a may be configured to output the light emitted from the side surface of the light emitting part 30' to the front side and may be disposed radially with respect to the light emitting part 30'.

In detail, the light emitting part 30' that emits light through the side surface may be disposed in the middle, and the plurality of light guides 54a may be disposed to extend from the side surface of the light emitting part 30'. The light having straightness may be emitted from the side surface of the one light emitting part 30', and the emitted light is input to the plurality of light guides 54a to be converted to surface-light and may be output to the front side. When the light is output not from the side surface of the light emitting part 30' but to the front side, the plurality of light emitting parts 30' has to be provided to correspond to the plurality of light guides 54a, respectively, but the light emitting part 30' of the present disclosure is configured to output the light from the side surface, and thus the light may be output from the plurality of light guides 54a by the one light emitting part 30'.

Each of the plurality of light guides 54*a* may include a light input surface 54*b*, to which the light is input from the light emitting part 30', and a light output surface 54*c*, from which the light input to the light input surface 54*b* is output. Here, a lens part 40' may be formed on the light input surface 54*b*.

For example, the light guides 54*a* may be disposed to be spaced apart from the light emitting part 30'. The light input surface 54*b* may be disposed to face the side surface of the light emitting part 30', and the light output surface 54*c* may be disposed to face the front side. The light input through the light input surface 54*b* may be totally reflected on surfaces, other than the light output surface 54*c*, and may be output to the front side through the light output surface 54*c*.

As an example, the light emitting part 30' may include four side surfaces that emit the light. Furthermore, four light guides 54*a* may be provided to correspond to the four side surfaces.

The light input surfaces 54*b* provided in the four light guides 54*a* may be disposed to face the four side surfaces of the light emitting part 30, respectively. However, the number of the side surfaces of the light emitting part 30' is not limited thereto but may be changed to various numbers, and the number of the light guides 54*a* also may be changed to correspond to the number of the side surfaces of the light emitting part 30'.

As in the illustrated embodiment, cross-sections of the light guides 54*a*, which are perpendicular to an extension direction thereof, may be circular. However, the cross-sectional shapes of the light guides 54*a* are not limited thereto, and may be modified to various shapes as long as the light output from the light input surface 54*b* may be output to the light output surface 54*c*.

LED Module According to Fifth Embodiment

Figure 27:
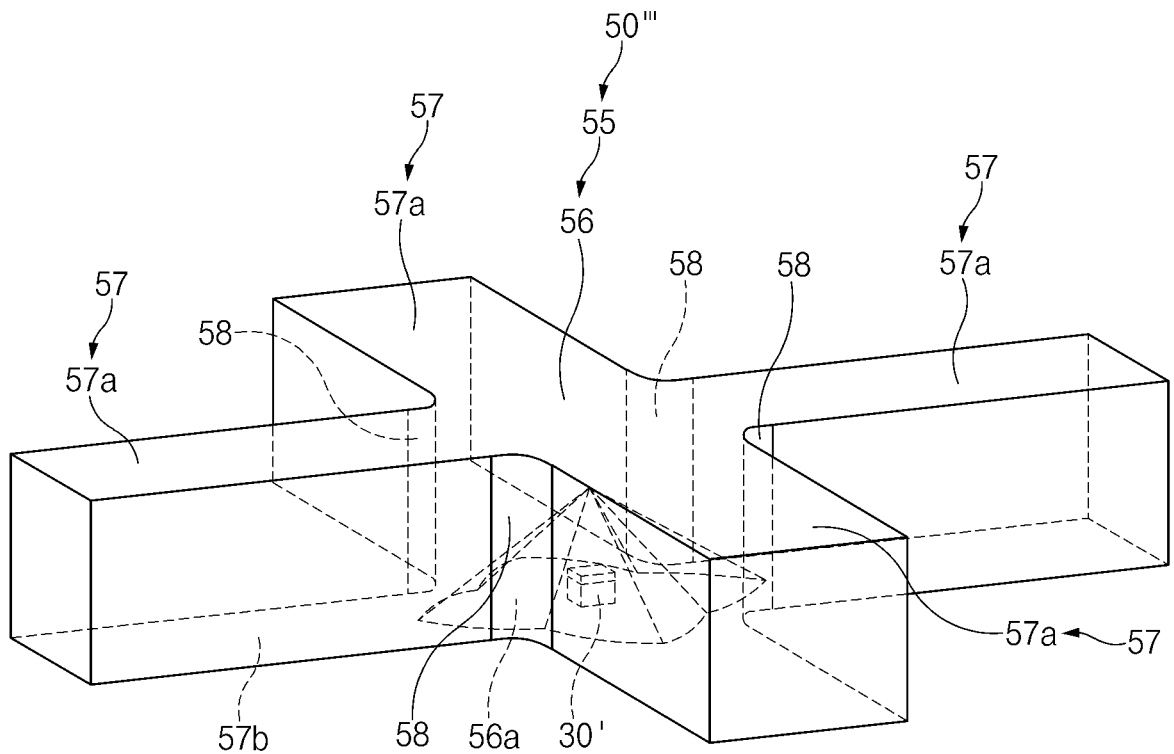
FIG. 27 is a perspective view illustrating an LED module according to a fifth embodiment of the present disclosure.
Figure 28:
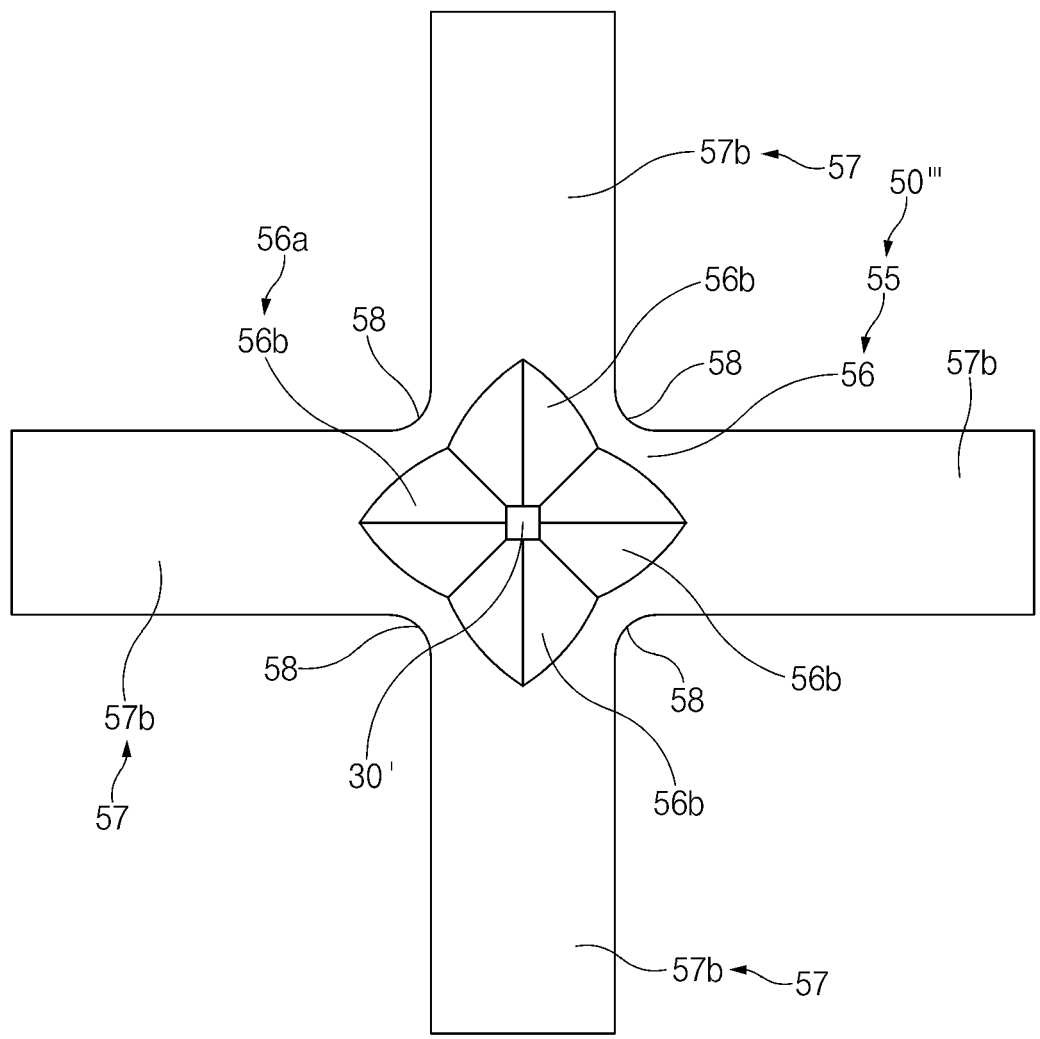
FIG. 28 illustrates an LED module according to a fifth embodiment of the present disclosure, and is a view of FIG. 27, viewed from a lower side.
Figure 29:
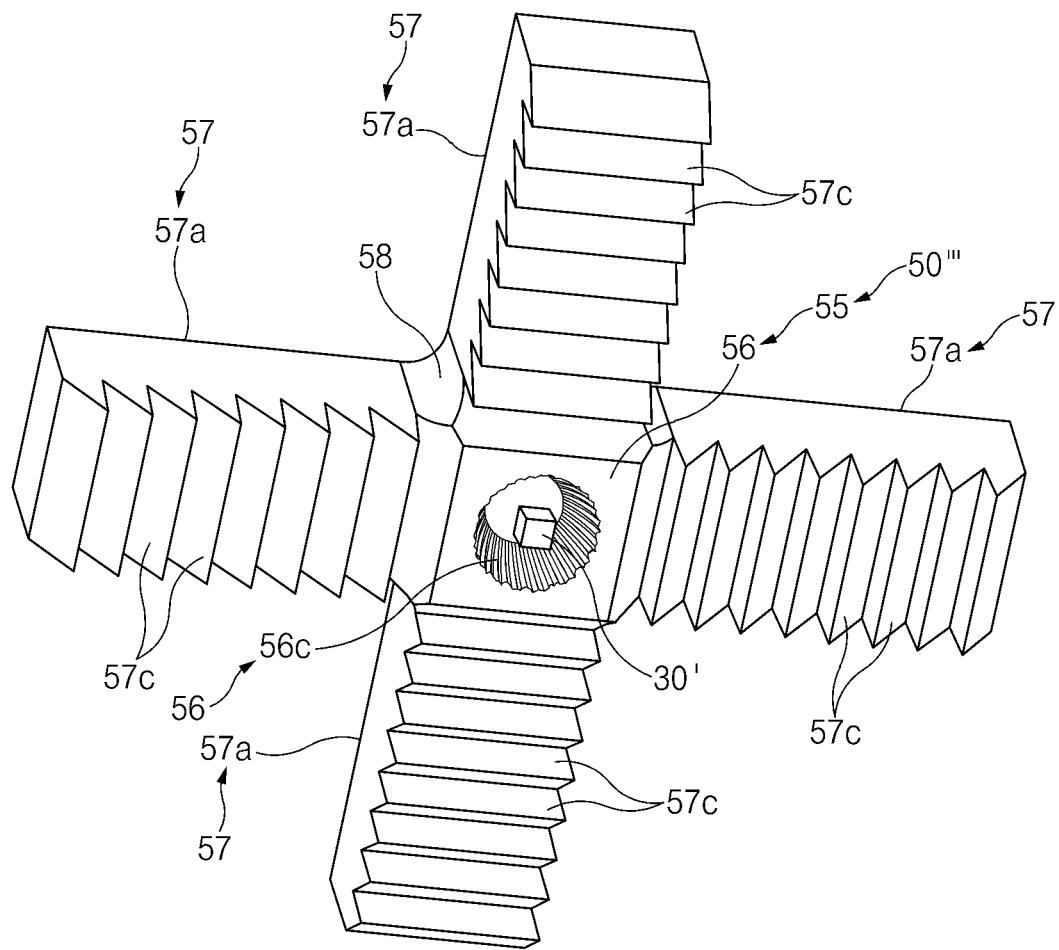
FIG. 29 illustrates a modification of an LED module according to a fifth embodiment of the present disclosure.
Figure 30:
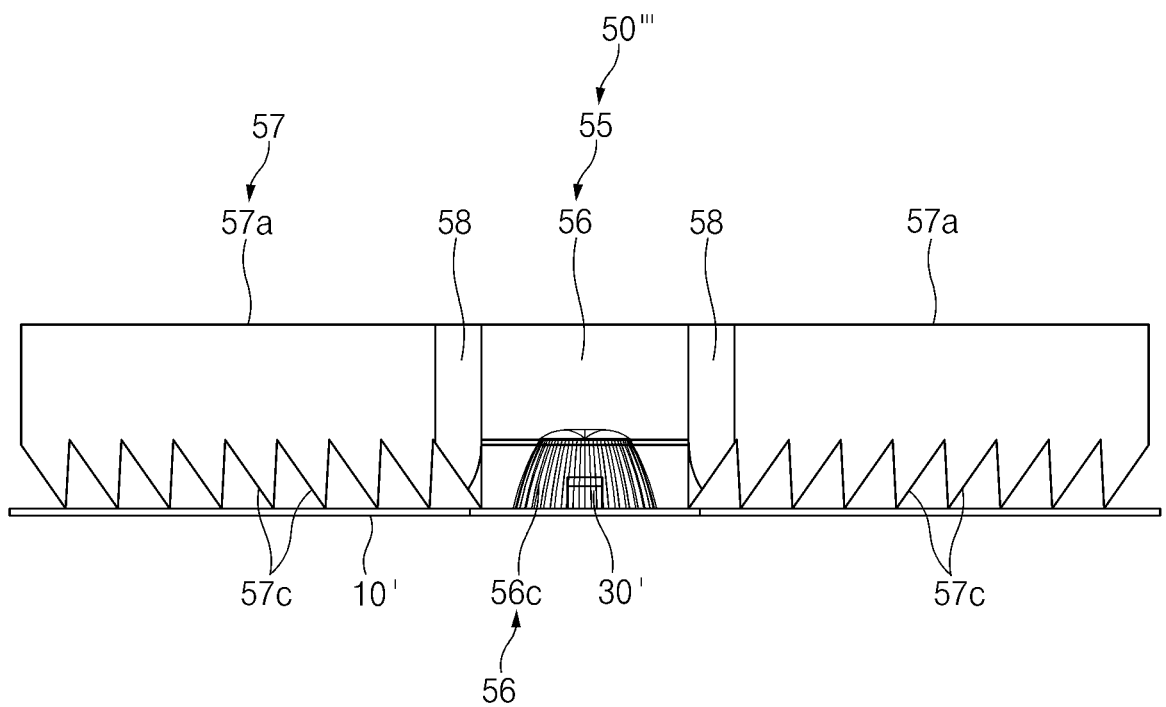
FIG. 30 is a view of FIG. 29, when viewed from a lateral side.
Figure 31:
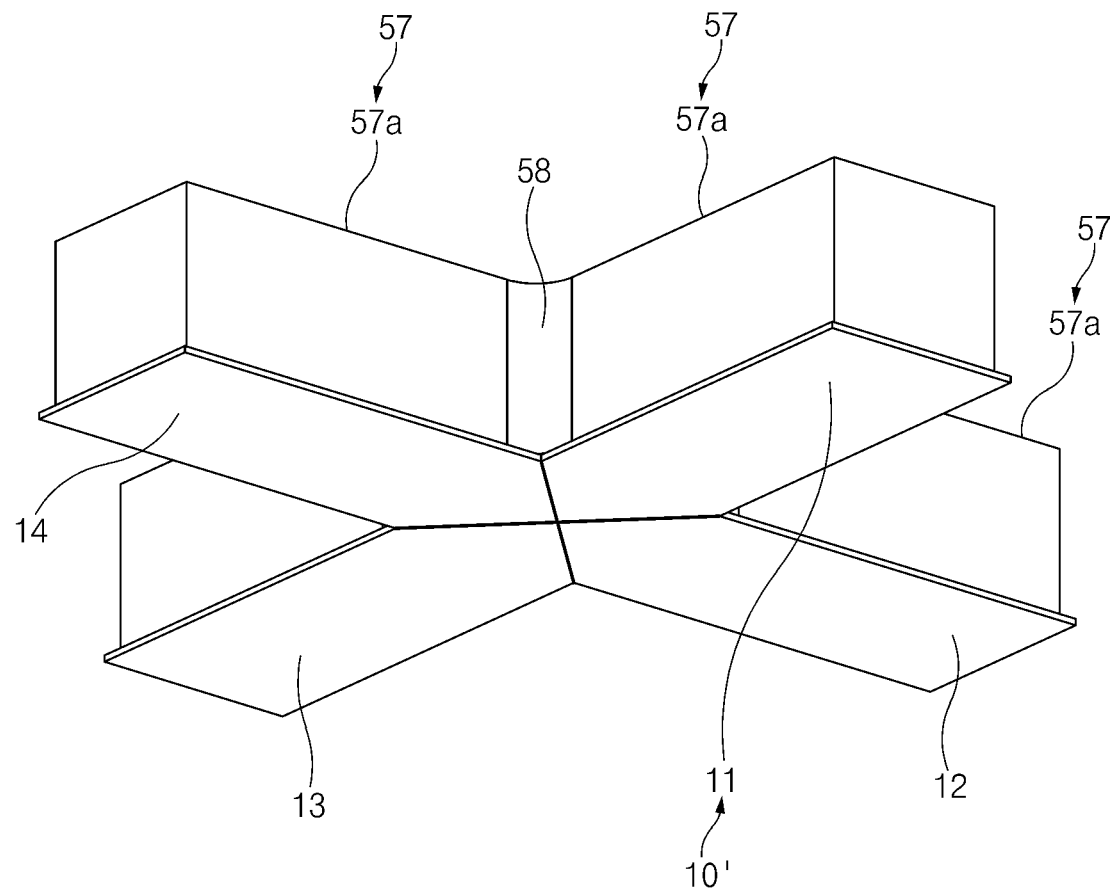
FIG. 31 illustrates another modification of an LED module according to a fifth embodiment of the present disclosure.
Figure 32:
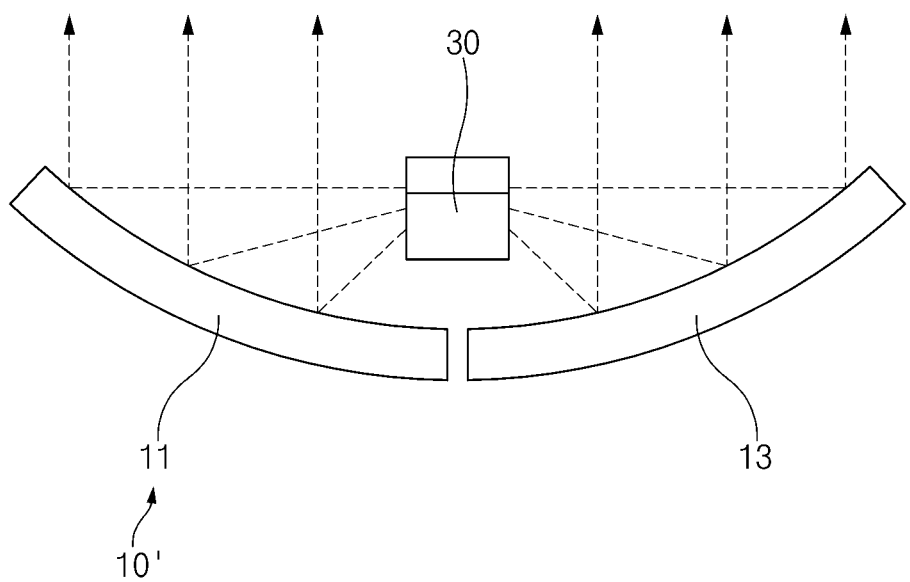
FIG. 32 is a view illustrating another modification of an LED module according to a fifth embodiment of the present disclosure.

FIGS. 27 to 32 illustrate an LED module according to a fifth embodiment of the present disclosure. FIG. 27 is a perspective view illustrating the LED module according to the fifth embodiment of the present disclosure. FIG. 28 illustrates the LED module according to the fifth embodiment of the present disclosure, and is a view of FIG. 27, viewed from a lower side. FIG. 29 illustrates a modification of the LED module according to the fifth embodiment of the present disclosure. FIG. 30 is a view of FIG. 29, when viewed from a lateral side. FIG. 31 illustrates another modification of the LED module according to the fifth embodiment of the present disclosure. FIG. 32 is a view illustrating another modification of the LED module according to the fifth embodiment of the present disclosure.

The LED module according to the fifth embodiment of the present disclosure is different from that of the first embodiment in the panel part 50'''. Accordingly, the fifth embodiment of the present disclosure may include all the configurations of the first embodiment, except for the above-described differences. Hereinafter, the same reference numerals will be used for the same elements, and a repeated description thereof will be omitted.

Referring to FIGS. 27 to 32, the panel part 50''' according to the fifth embodiment of the present disclosure may include a light guide unit. Furthermore, the light guide unit according to the fifth embodiment may be implemented by a second light guide unit 55.

The panel part 50''' may include the second light guide unit 55. The second light guide unit 55 may include a body part 56 and light output parts 57.

The light emitted from the side surface of the light emitting part 30' may be input to the body part 56. The body part 56 may include a light input surface 56*a*, to which the light is input from the light emitting part 30'. Here, the lens part 40' may be formed on the light input surface 56*a*.

The light output parts 57 may extend from the body part 56, and the plurality of light output parts 57 may be provided to output the light input to the body part 56 to the front side and may be disposed radially with respect to the body part 56. Here, each of the plurality of light output parts 57 may include a light output surface 57*a*, from which the light input from the light input surface 56*a* is output.

In detail, the body part 56 may be integrally formed with the light output parts 57, and the light output parts 57 may extend radially with respect to the body part 56. For example, as illustrated, when four light output parts 57 are provided, the second light guide unit 55 may have a cross (+) shape. However, a shape of the second light guide unit 55 may vary according to the number of the light output parts 57.

For example, the body part 56 may have a concave portion, at which the light emitting part 30' is accommodated, and the light input surface 56*a* may be formed at the concave portion. The light output from the light emitting part 30' may be input to the light input surface 56*a*, and may be guided to the light output parts 57.

Meanwhile, the second light guide unit 55 may further include a deposition surface 58. The deposition surface 58 may be provided at a corner portion, at which adjacent light output parts 57 meet each other, and a material that reflects the light may be deposited.

In this way, because the deposition surfaces 58 that reflect the light is provided at portions, at which the plurality of light output parts 57 meet each other, the light may be restrained from being leaked through the corner portions. Accordingly, the light emitted from the light emitting part 30' is intensively emitted to the light output parts 57 whereby optical efficiency may be enhanced. For example, the material deposited on the deposition surface 58 may be aluminum (Al), but the present disclosure is not limited thereto, and various reflective materials that may reflect the light may be applied.

Meanwhile, the light input surface 56*a* according to the fifth embodiment of the present disclosure may have various shapes. According to a shape of the light input surface 56*a*, an irradiation distance or a diffusion degree of the light emitted from the light emitting part 30' may vary. In detail, refraction of the light emitted from the light emitting part 30' may vary according to the shape of the light input surface 56*a*, and a path of the light may vary accordingly. Accordingly, the shape of the light input surface 56*a* may be determined according to a target, such as securement of uniformity of light, which is to be achieved.

For example, referring to FIGS. 27 and 28, the light input surface 56*a* may be divided into the plurality of light input parts 56*b* corresponding to the plurality of light output parts 57, respectively, and a width of each of the light input parts 56*b* may decrease as it goes toward an end of the corresponding light output part 57.

For example, when the light emitting part 30' includes four side surfaces and four light output parts 57 are provided, the light input surface 56*a* may include the four light input parts 56*b* corresponding to the light output parts 57. A width of each of the light input parts 56*b* may decrease as it goes toward the light output part 57. Accordingly, the light emitted from the light emitting part 30' is intensively emitted to the light output parts 57 to reach a far distance. That is, due to the shapes of the light input parts 56b, the light emitted from the light emitting part 30' may be guided to ends of the light output parts 57.

Furthermore, for example, referring to FIGS. 29 and 30, the light input surface 56a may include diffusion bosses 56c that are repeatedly formed along a circumferential direction of a side surface of the light emitting part 30'.

For example, a shape of the light input surface 56a, which is obtained by cutting it in a direction that is perpendicular to the side surface of the light emitting part 30', may be circular, and the diffusion bosses 56c may be repeatedly formed on the light input surface 56a. Due to the diffusion bosses 56c, the light input from the light emitting part 30' to the light input surface 56a may be uniformly diffused toward the light output parts 57. Accordingly, a uniformity of a brightness of the light output through the light output surface 57a may be enhanced.

Meanwhile, referring to FIGS. 29 and 30, each of the light output parts 57 may further include a reflective surface 57b. The reflective surface 57b may be provided on an opposite surface to the light output surface 57a, and the light input from the light input surface 56a may be reflected to the light output surface 57a. Here, a reflective optic 57c having a fine boss shape may be formed on the reflective surface 57b.

In detail, the light output surface 57a may be formed on a surface that faces the front side of the light output part 57, and the reflective surface 57b may be formed on a surface that faces the rear side of the light output part 57. The reflective optic 57c may be recessed toward the front side, and a plurality of reflective optics 57c may be provided on the reflective surface 57b. For example, a width of the reflective optic 57c may decrease as it goes toward the front side, but a shape of the reflective optic 57c is not limited thereto.

The reflective optic 51c may reflect the light emitted from the side surface of the light emitting part 30 such that the light is reflected toward the front side.

Meanwhile, referring to FIGS. 31 and 32, an LED module according to a modification of the fifth embodiment of the present disclosure may further include a reflection unit. The reflection unit may be disposed on a rear side of the light guide unit, and may be configured to reflect the light output from the light emitting part 30'. Furthermore, the reflection unit may include a plurality of reflection covers 11, 12, 13, and 14 that are separated from each other.

Here, the reflection unit may be implemented by the cover part 10 or the board part 20', and also may be implemented by a separate member disposed on the rear side of the light guide unit. FIG. 31 illustrates an example, in which the reflection unit is implemented by a cover part 10'. Furthermore, FIG. 32 illustrates a conceptual view illustrating a concept of the reflection unit according to an embodiment of the present disclosure.

For example, referring to FIG. 31, the reflection unit may be implemented by the cover part 10', and the cover part 10' may be separated into a plurality of reflection covers 11, 12, 13, and 14. For example, when the light is output from the four side surfaces of the light emitting part 30', the cover part 10' may include the first reflection cover 11, the second reflection cover 12, the third reflection cover 13, and the fourth reflection cover 14, which are separated each other. Accordingly, the plurality of reflection covers 11, 12, 13, and 14 may be configured to reflect the light emitted from the plurality of side surfaces of the one light emitting part 30' to the front side.

Although only one reflector is utilized because the light source of the existing optical system is configured to emit the light to the front side, the light emitting part 30' according to the present disclosure is configured to output the light from the plurality of side surfaces, and thus the light radiated to lateral sides by using the plurality of reflection covers 11, 12, 13, and 14 may be reflected to the front side.

Furthermore, in the reflection unit according to the present disclosure, because the plurality of reflection covers 11, 12, 13, and 14 are separated from each other, the path, along which the light is reflected, may be controlled individually by individually designing the reflection covers.

LED Module According to Sixth Embodiment

Figure 33:
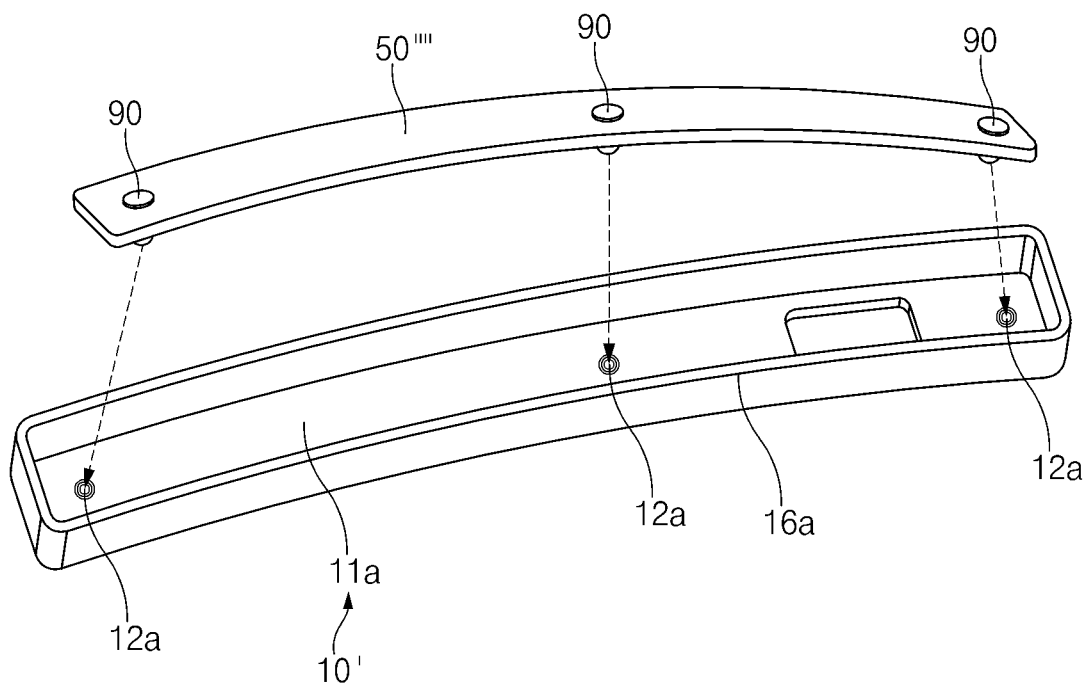
FIG. 33 is a conceptual view illustrating an LED module according to a sixth embodiment of the present disclosure.
Figure 34:
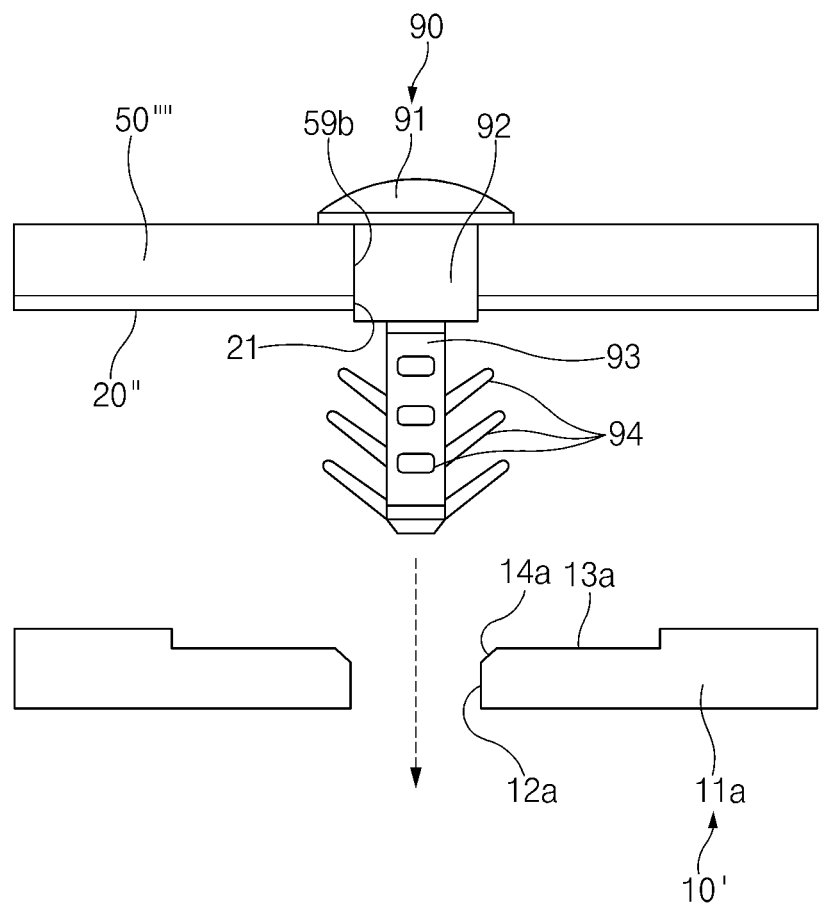
FIG. 34 is an enlarged cross-sectional view of FIG. 33.
Figure 35:
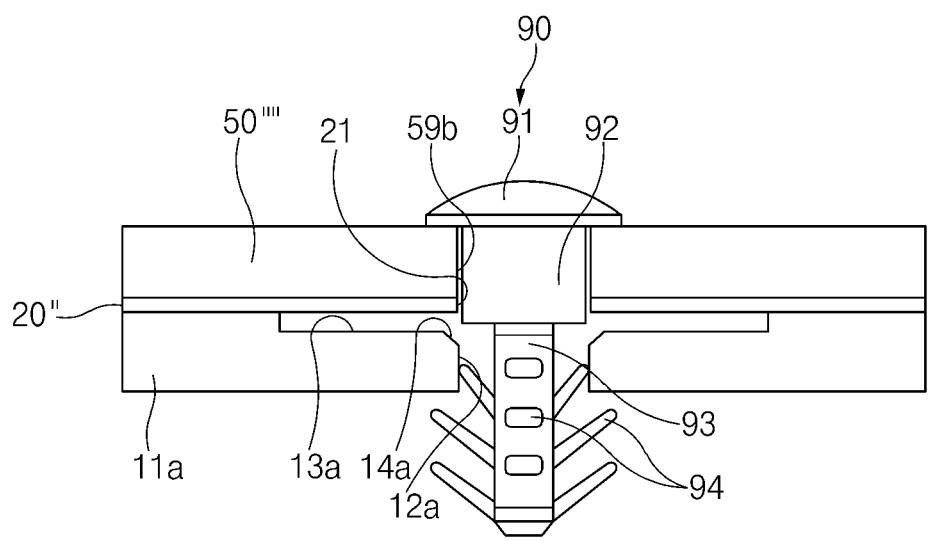
FIG. 35 is a view illustrating a state, in which a pin member is coupled to a cover part in FIG. 34.

FIGS. 33 to 35 illustrate an LED module according to a sixth embodiment of the present disclosure. FIG. 33 is a conceptual view illustrating the LED module according to the sixth embodiment of the present disclosure. FIG. 34 is a partially enlarged cross-sectional view of FIG. 33. FIG. 35 is a view illustrating a state, in which a pin member is coupled to a cover part in FIG. 34.

The LED module according to the sixth embodiment of the present disclosure may be different from that of the first embodiment, in coupling of the cover part 10', a board part 20", and a panel part 50"''. Accordingly, the sixth embodiment of the present disclosure may include all the configurations of the first embodiment, except for the above-described differences. Hereinafter, the same reference numerals will be used for the same elements, and a repeated description thereof will be omitted.

Referring to FIGS. 33 to 35, the LED module according to the sixth embodiment of the present disclosure may further include a pin member 90.

The pin member 90 is configured to pass through the panel part 50", the board part 20", and the cover part 10'. The panel part 50"'', the board part 20", and the cover part 10' may be coupled to each other by the pin member 90.

In detail, the pin member 90 may include a head 91, a pin body 92, an extension part 93, and an assembly boss 94.

The head 91 is configured to be stopped by one surface of the panel part 50"''. The pin body 92 may be formed on one side of the head 91, and may be configured to pass through the panel part 50".

The extension part 93 may extend from the pin body 92, and may be configured to pass through an assembly hole 12a formed in the cover part 10'. Furthermore, the assembly boss 94 protrudes from an outer surface of the extension part 93, and may be configured to be elastically stopped by the cover part 10'.

In detail, the cover part 10' may include a support plate 11a that is configured to support the board part 20" and the panel part 50"'', and in which the assembly hole 12a, through which the extension part 93 passes, is formed. Furthermore, a pin hole 59b may be formed in the panel part 50"'', and a through-hole 21 may be formed in the board part 20".

The pin member 90 may sequentially pass through the pin hole 59b, the through-hole 21, and the assembly hole 12a. For example, in the assembly state, the head 91 of the pin member 90 may be formed to be larger than the pin hole 59b to be provided on one surface of the panel part 50"'', and the pin body 92 may be inserted into and disposed at the pin hole 59b and the through-hole 21. Furthermore, the extension part 93 may pass through the assembly hole 12a of the cover part 10'.

Here, an outer diameter of the extension part 93 may be formed to be larger than the pin body 92. Furthermore, the outer diameter of the extension part 93 may be formed to be smaller than an inner diameter of the assembly hole 12a. In a state, in which the extension part 93 is inserted into and disposed at the assembly hole 12a, the assembly boss 94 may be configured to be stopped by the cover part 10'. Accordingly, the pin member 90 may be assembled in the cover part 10', and the panel part 50'''', the board part 20'', and the cover part 10' may be assembled.

In this way, according to the sixth embodiment of the present disclosure, because the panel part 50'''', the board part 20'', and the cover part 10' are assembled by the pin member 90, they may be accurately assembled at predetermined locations of the members during assembly thereof. Furthermore, because the assembly boss 94 of the pin member 90 is assembled to be stopped by the cover part 10', a convenience of assembling may be enhanced.

Meanwhile, referring to FIGS. 34 and 35, the support plate 11a may include a stepped surface 13a formed on a surface that faces the board part 20'' and formed at a circumferential area of the assembly hole 12a, and an inclined surface 14a formed at a portion, at which the stepped surface 13a and the assembly hole 12a meet each other, to be inclined.

The embodiment of the present disclosure may prevent the board part 20'' and the cover part 10' from being spaced apart from each other by the pin body 92 when the pin member 90 is assembled, by the stepped surface 13a. That is, the support plate 11a may alleviate an assembly tolerance of the pin member 90 when being assembled, by the stepped surface 13a. Furthermore, in the embodiment of the present disclosure, the pin member 90 may be easily inserted into and disposed at the assembly hole 12a due to the inclined surface 14a.

Meanwhile, a plurality of assembly bosses 94 may be provided to be spaced apart from each other along at least any one of a circumferential direction and an extension direction of an outer surface of the extension part 93. Furthermore, the assembly bosses 94 may extend to be inclined toward the head 91 as it goes farther away from an outer surface of the extension part 93.

For example, as in the illustrated embodiment, a plurality of assembly bosses 94 according to the present disclosure may be provided along the circumferential direction of the outer surface of the extension part 93, and a plurality of assembly bosses 94 may be provided along the extension direction of the assembly bosses 94 as well. Accordingly, the pin member 90 may be firmly assembled in the support plate 11a of the cover part 10'. Furthermore, because the assembly bosses 94 are formed to be inclined, the pin member 90 may be easily inserted into the assembly hole 12a.

LED Module According to Seventh Embodiment

Figure 36:
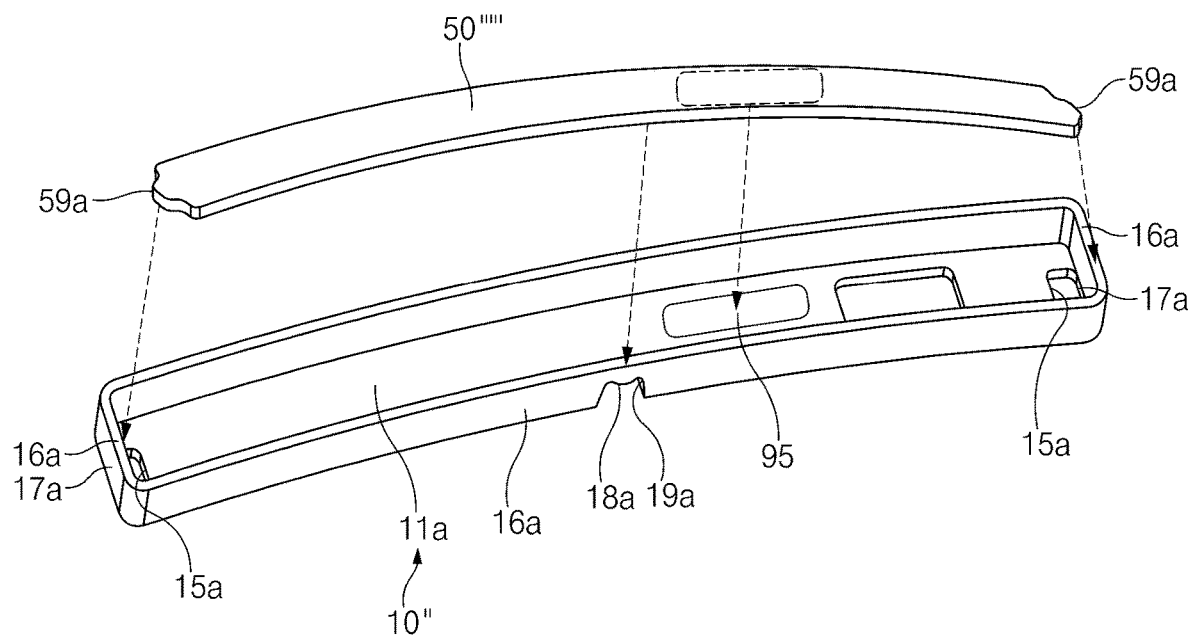
FIG. 36 is a conceptual view illustrating an LED module according to a seventh embodiment of the present disclosure.
Figure 37:
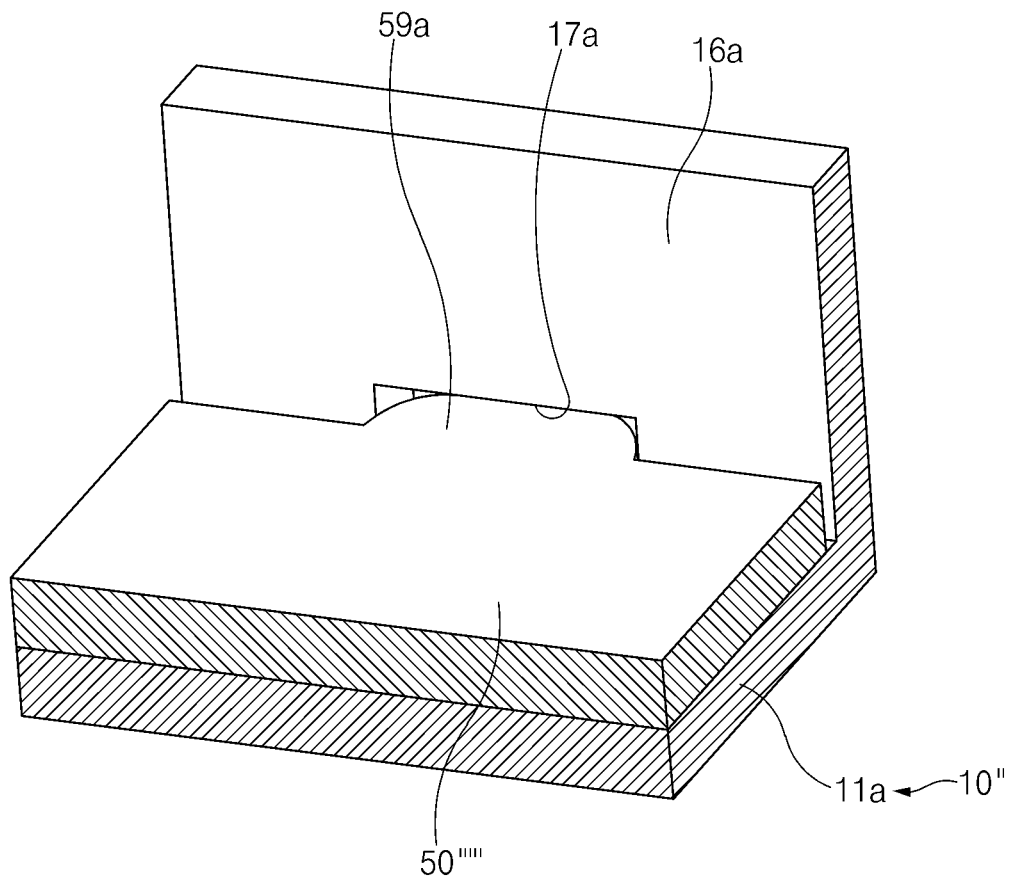
FIG. 37 illustrates an LED module according to a seventh embodiment of the present disclosure, and is a partially enlarged perspective view of FIG. 36.
Figure 38:
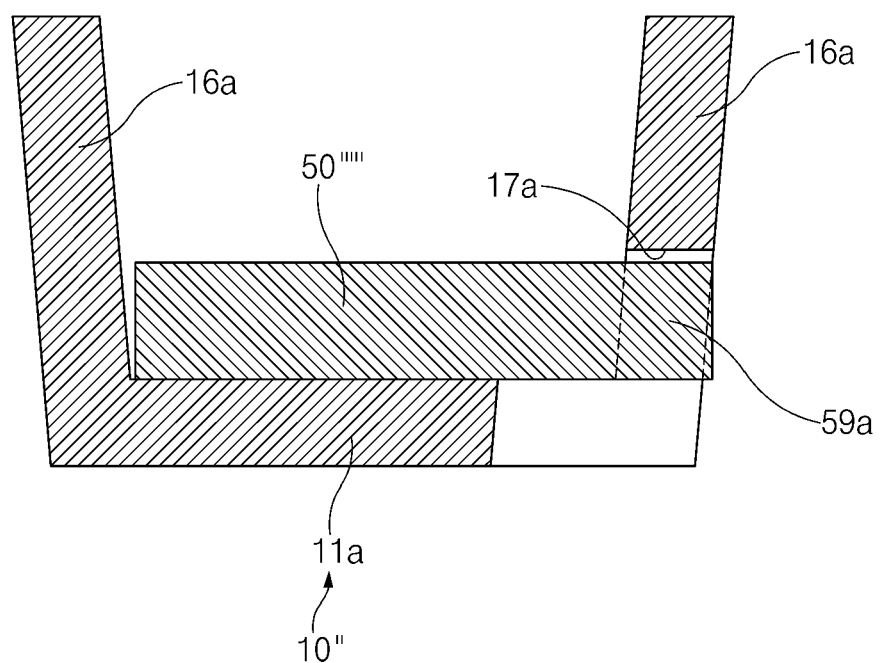
FIG. 38 is a cross-sectional view illustrating a cross-section of FIG. 37.
Figure 39:
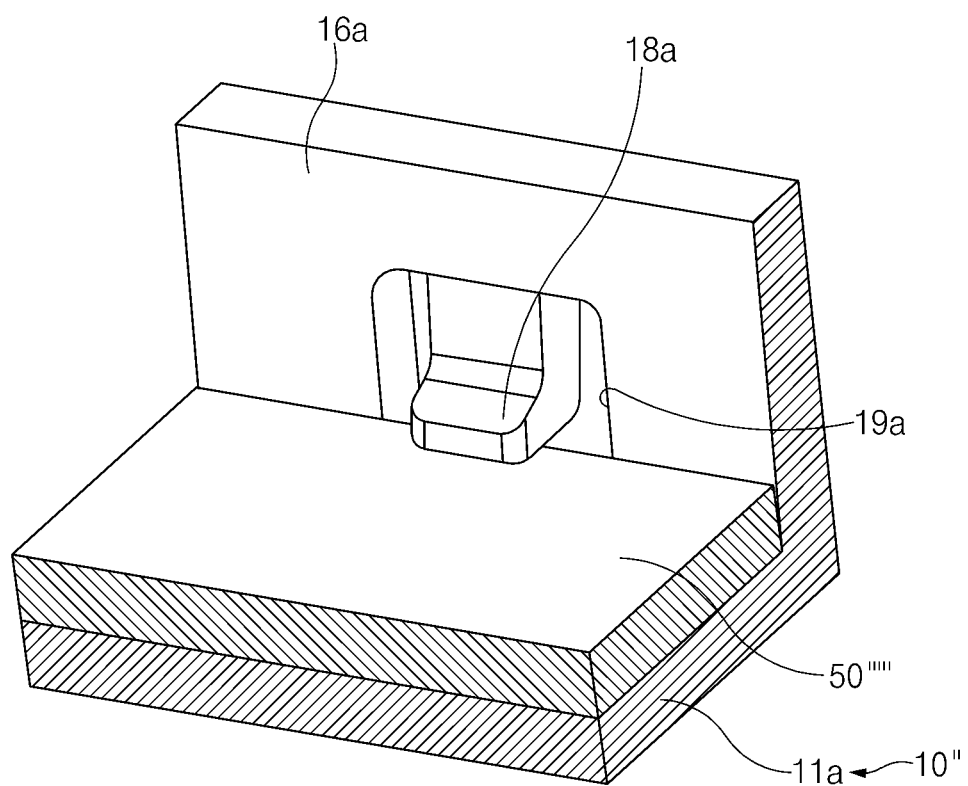
FIG. 39 illustrates an LED module according to a seventh embodiment of the present disclosure, and is a partially enlarged perspective view of FIG. 36.
Figure 40:
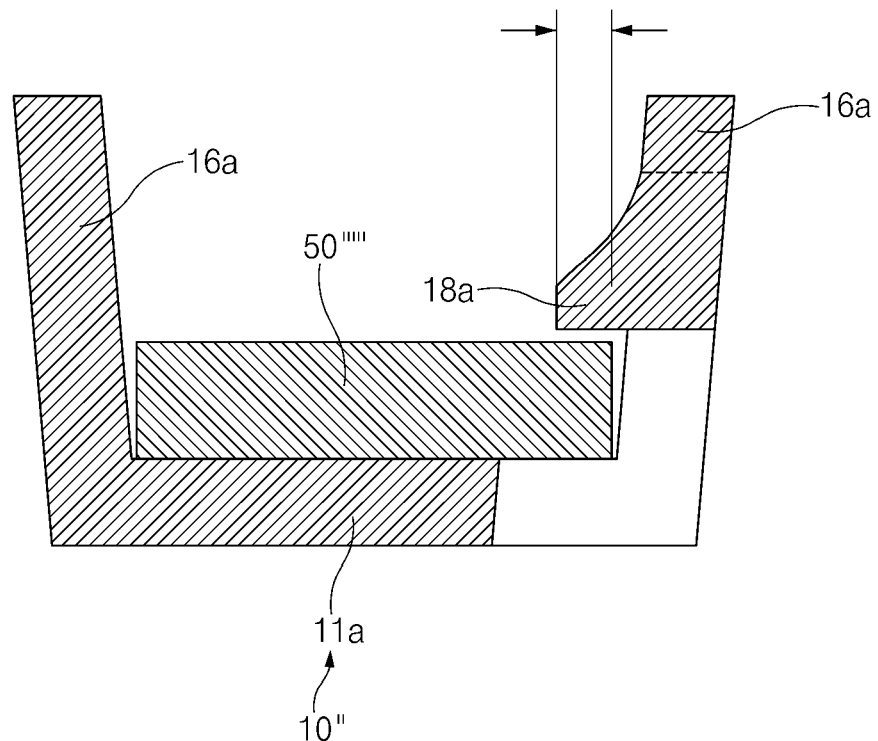
FIG. 40 is a cross-sectional view illustrating a cross-section of FIG. 39.

FIGS. 36 to 40 illustrate an LED module according to a seventh embodiment of the present disclosure. FIG. 36 is a conceptual view illustrating the LED module according to the seventh embodiment of the present disclosure. FIG. 37 illustrates the LED module according to the seventh embodiment of the present disclosure, and is a partially enlarged perspective view of FIG. 36. FIG. 38 is a cross-sectional view illustrating a cross-section of FIG. 37. FIG. 39 illustrates the LED module according to the seventh embodiment of the present disclosure, and is a partially enlarged perspective view of FIG. 36. FIG. 40 is a cross-sectional view illustrating a cross-section of FIG. 39.

The LED module according to the seventh embodiment of the present disclosure may be different from that of the first embodiment, in coupling of a cover part 10'', the board part 20'', and a panel part 50''''. Accordingly, the sixth embodiment of the present disclosure may include all the configurations of the first embodiment, except for the above-described differences. Hereinafter, the same reference numerals will be used for the same elements, and a repeated description thereof will be omitted.

Referring to FIGS. 36 to 38, the LED module according to the sixth embodiment of the present disclosure may include the cover part 10'', in which the insertion hole 17a is formed, the board part 20'' connected to a front side of the cover part 10'', the light emitting part 30 electrically connected to the board part 20'', disposed on the front side of the board part 20'', and configured to emit the light through a side surface thereof, and the panel part 50'' disposed on the front side of the board part 20'' and assembled with the cover part 10'', and an insertion boss 59a inserted into the insertion hole 17a may be formed in the panel part 50''''.

In detail, the cover part 10'' may include a support plate 11a that supports the board part 20'' and the panel part 50'''', and a side wall 16a that extends toward the panel part 50'''' at a periphery of the support plate 11a. Furthermore, the insertion boss 59a may be inserted into the insertion hole 17a.

For example, a plurality of side walls 16a may be provided along a peripheral circumference of the support plate 11a, and a pair of insertion holes 17a may be formed on facing side walls 16a of the plurality of side walls 16a. The insertion boss 59a may be formed in the panel part 50'''' to correspond thereto.

When the cover part 10'' and the panel part 50'''' are assembled, the insertion boss 59a is inserted into the insertion hole 17a whereby the assembling is finished. Then, the assembling may be made while the board part 20'' is interposed between the cover part 10'' and the panel part 50''''.

In this way, according to the LED module according to the fifth embodiment of the present disclosure, because the insertion bosses 59a that protrude from opposite ends of the panel part 50'''' is assembled to be inserted into the insertion holes 17a formed in the cover part 10'', a convenience of assembling may be enhanced. Furthermore, during the assembling, the panel part 50'''' and the cover part 10'' may be accurately assembled at predetermined locations.

Meanwhile, referring to FIG. 38, an extension hole 15a that extends from the insertion hole 17a may be formed in the support plate 11a. Due to the extension hole 15a, the insertion boss 59a may be easily inserted into the insertion hole 17a.

Meanwhile, referring to FIGS. 36, and 39 to 40, the cover part 10'' may include the support plate 11a that supports the panel part 50'''', and the side wall 16a including a stopper hook 18a that extends from a periphery of the support plate 11a toward the panel part 50'''', protrudes toward the panel part 50'''', and is configured to be elastically deformed by an external force. Furthermore, the panel part 50'''' may be coupled to be elastically stopped between the stopper hook 18a and the support plate 11a.

In detail, a hook hole 19a may be formed in the side wall 16a, and the stopper hook 18a may be formed at a portion, at which the hook hole 19a is formed. When the panel part 50'''' and the cover part 10'' are assembled, the stopper hook 18a may be pressed by the panel part 50'''' to be elastically deformed so as to be widened outwards, and when the assembling of the panel part 50'''' is finished, the stopper hook 18a may return to an original location to press the panel part 50''''.

For example, the hook hole 19a and the stopper hook 18a may be formed between a pair of insertion holes 17a formed to face each other. Accordingly, when the panel part 50″″ and the cover part 10″ are assembled, the insertion bosses 59a provided at opposite ends of the panel part 50″″ may be inserted into the insertion holes 17a, and an intermediate portion of the panel part 50″″ may be coupled to be elastically stopped by the stopper hook 18a. Due to the structure, the panel part 50″″ may be further attached to the cover part 10″.

Meanwhile, referring to FIG. 36, the LED module according to the seventh embodiment of the present disclosure may further include an adhesive member 95. The adhesive member 95 may be attached to a surface of the support plate 11a, which faces the panel part 50″″, and a surface of the panel part 50″″, which faces the support plate 11a.

For example, the adhesive member 95 may be a double-sided tape. However, the kind of the adhesive member 95 is not limited thereto, and various kinds may be applied as long as the panel part 50″″ and the support plate 11a may be attached to be adhered to each other.

Figure 41:
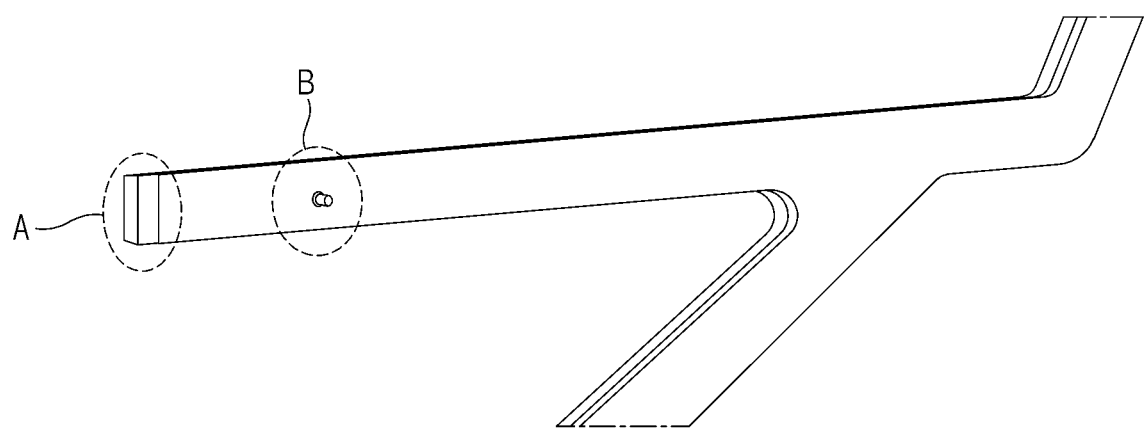
FIGS. 41 to 43 are views illustrating examples, to which LED modules according to a sixth embodiment and a seventh embodiment of the present disclosure are applied together.
Figure 42:
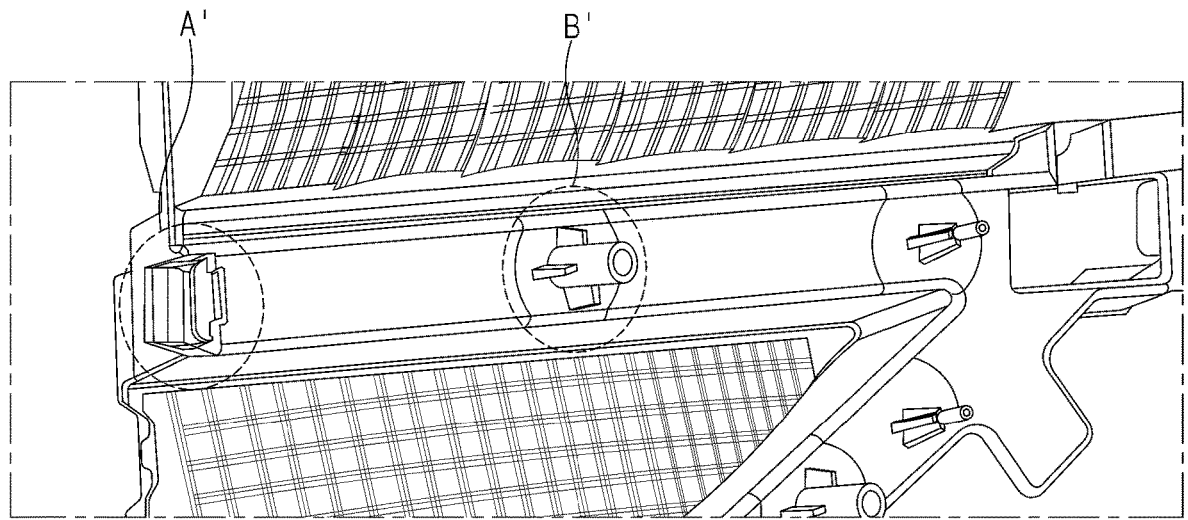
Figure 43:
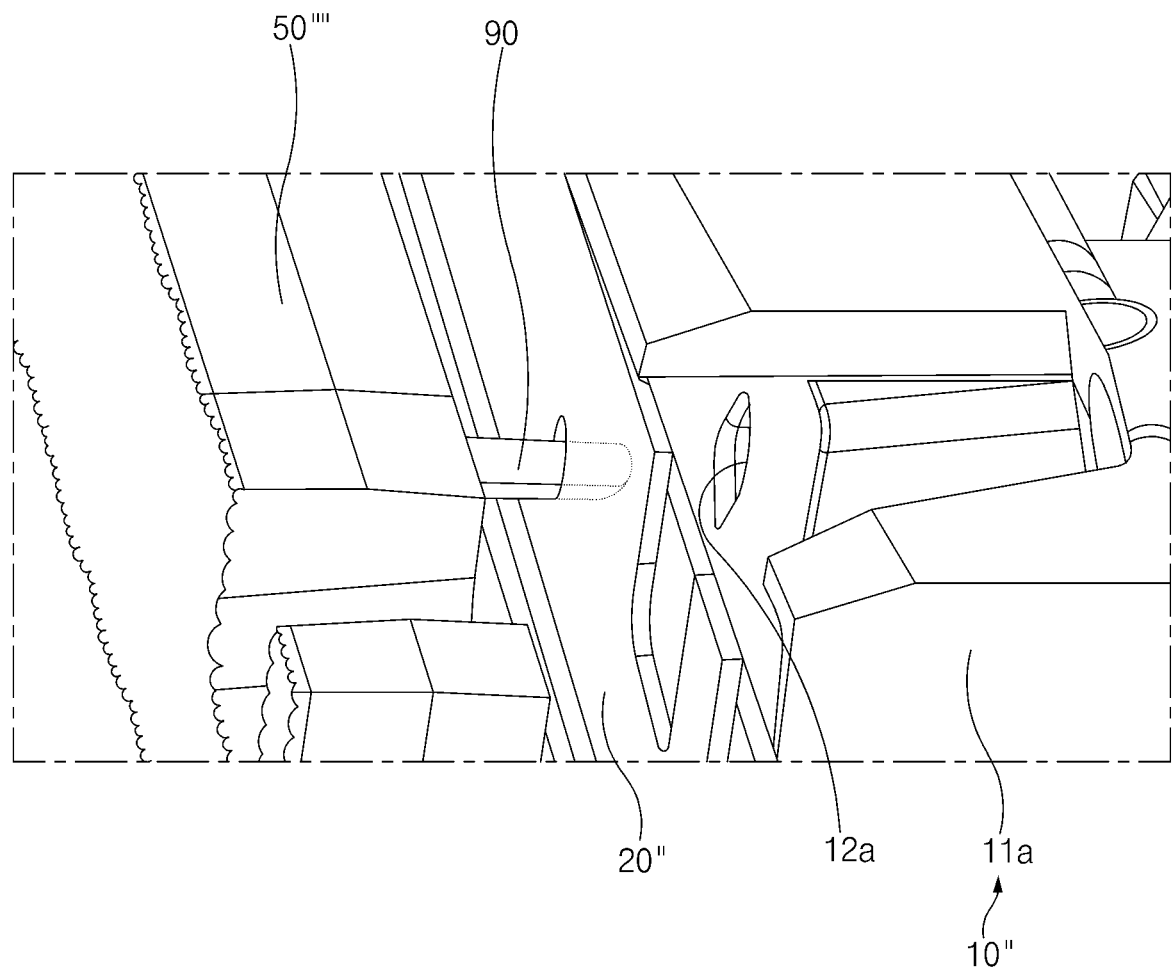

Meanwhile, FIGS. 41 to 43 illustrate examples, to which LED modules according to the sixth embodiment and the seventh embodiment of the present disclosure are applied. Portion A of FIG. 41 is a portion, at which the insertion boss 59a is formed in the panel part 50″″, and portion B of FIG. 41 illustrates a state, in which the pin member 90 passes through the panel part 50″″ and the board part 20″. Portion A' of FIG. 42 illustrates a state, in which the insertion boss 59a of the panel part 50″″ is inserted into the insertion hole 17a of the cover part 10″, and portion B' of FIG. 42 illustrates an example, in which the pin member 90 is assembled in the assembly hole 12a of the cover part 10″. FIG. 43 illustrates an example, in which the pin member 90 is assembled.

As in the illustrated embodiments, the sixth embodiment and the seventh embodiment according to the disclosure are not contradictory, but a configuration that includes both of the sixth embodiment and the seventh embodiment also is possible. For example, an LED module according to another embodiment of the present disclosure may include both of an assembly structure due to the pin member 90 and an assembly structure due to the insertion boss 59a and the stopper hook 18a.

Vehicle

Hereinafter, a vehicle including the LED modules according to the first to third embodiments of the present disclosure will be described below. Here, the vehicle is not limited simply to four-wheel vehicles, and has to be construed to widely include a transportation means such as a two-wheel vehicle. The vehicle may include a vehicle body and an LED module.

As illustrated in FIG. 3, the LED module may include the light emitting part 30, the lens part 40, and the panel part 50. The light emitting part 30 may be configured to emit light through a side surface thereof. The light emitting part 30 may be a 4F LED. The lens part 40 may surround the side surfaces of the light emitting part 30. The lens part 40 may be inserted into and disposed at the panel part 50. The optic 51 having a fine boss shape may be formed on an outer surface of the panel part 50.

According to the embodiment of the present disclosure, because a reflection plate is not necessary and the lens part may be adhered to the cover part, the volume of the product may be reduced and the weight of the product may be reduced.

According to the embodiments of the present disclosure, because the light may be emitted from the side surfaces of the light emitting and the plurality of fine optics reflect the light at various angles at different locations, a uniformity of brightness may be secured.

According to the embodiments of the present disclosure, the light may be output from the plurality of light guides by one light emitting part.

Although the specific embodiments of the present disclosure have been described until now, the spirit and scope of the present disclosure are not limited to the specific embodiments, and may be variously corrected and modified by an ordinary person in the art, to which the present disclosure pertains, without changing the essence of the present disclosure claimed in the claims.

What is claimed is:

1. An LED module comprising:
    a cover part having a front side facing in a first direction;
    a board part disposed on the front side of the cover part and having a front side facing in the first direction;
    a light emitting part disposed on the front side of the board part, electrically connected to the board part and configured to emit light through a side surface of the light emitting part; and
    a panel part disposed on the front side of the board part and comprising a light guide unit configured to guide and output the light emitted from the side surface of the light emitting part,
    wherein the light guide unit comprises:
        a body part configured to receive the light emitted from the side surface of the light emitting part; and
        a plurality of light output parts extending from and disposed radially with respect to the body part and configured to emit the light received at the body part to a front side of the panel part.

2. The LED module of claim 1, further comprising:
    a lens part disposed on the front side of the board part and surrounding the light emitting part; and
    an optic disposed at the panel part along with the lens part and having a fine boss shape.

3. The LED module of claim 2, wherein the optic includes a first optic disposed at a rear surface of the panel part, recessed toward a front side of the panel part, and configured to reflect the light emitted from the side surface of the light emitting part and guide the reflected light toward the front side of the panel part, the first optic having a shape of which a vertical length decreases along distance from the front side of the panel part.

4. The LED module of claim 3, wherein the optic further includes a second optic disposed at and protruding from a front surface of the panel part and configured to guide the light emitted from the side surface of the light emitting part toward the front side of the panel part.

5. The LED module of claim 1, wherein:
    a vertical length of the board part corresponds to that of the cover part, and
    a vertical length of the panel part corresponds to that of the board part.

6. The LED module of claim 1, further comprising an outer lens disposed on and spaced apart from a front surface of the panel part, wherein a vertical length of the outer lens corresponds to that of the panel part.

7. The LED module of claim 2, wherein:
    the panel part includes a first recess disposed at a rear surface of the panel part and having a shape corresponding to a shape of the lens part, and
    the lens part is disposed at the first recess.

8. The LED module of claim 3, wherein:
a vertical length of the board part is smaller than that of the cover part,
the panel part covers a side surface of the board part, and
the first optic includes a first area disposed at the side surface of the board part and a second area disposed at a front surface of the board part and stepped from the first area.

9. An LED module comprising:
a cover part;
a board part disposed on a front side of the cover part;
a light emitting part disposed on a front side of the board part, electrically connected to the board part and configured to emit light through a side surface of the light emitting part;
a panel part disposed on the front side of the board part and comprising a light guide unit including a plurality of light output parts configured to guide and output the light emitted from the side surface of the light emitting part;
a lens part disposed on the front side of the board part and surrounding the light emitting part; and
an optic disposed at the panel part along with the lens part and having a fine boss shape,
wherein the optic includes a first optic disposed at a rear surface of the panel part, recessed toward a front side of the panel part, and configured to reflect the light emitted from the side surface of the light emitting part and guide the reflected light toward the front side of the panel part, the first optic having a shape of which a vertical length decreases along distance from the front side of the panel part,
wherein a vertical length of the board part is smaller than that of the cover part, the panel part covers a side surface of the board part, and the first optic includes a first area disposed at the side surface of the board part and a second area disposed at a front surface of the board part and stepped from the first area, and
wherein the panel part further includes a second recess disposed at a rear surface of the panel part and having a size corresponding to that of the board part, and the board part is disposed at the second recess.

10. The LED module of claim 2, wherein the lens part has a semi-elliptical cross-sectional shape.

11. The LED module of claim 1, wherein:
the panel part includes a first light guide unit, and
the first light guide unit includes a plurality of light guides disposed radially with respect to the light emitting part and configured to output the light emitted from the side surface of the light emitting part to a front side of the panel part.

12. The LED module of claim 11, wherein each of the plurality of light guides includes:
a light input surface configured to receive the light emitted from the light emitting part; and
a light output surface configured to output the light received at the light input surface.

13. The LED module of claim 12, wherein:
the light emitting part includes four side surfaces configured to emit the light, and
the plurality of light guides includes four light guides provided corresponding to the four side surfaces of the light emitting part, respectively.

14. The LED module of claim 11, wherein each of the plurality of light guides has a circular cross-sectional shape.

15. The LED module of claim 1, wherein:
the body part includes a light input surface configured to receive the light emitted from the light emitting part, and
each of the plurality of light output parts includes a light output surface configured to output the light received at the light input surface.

16. The LED module of claim 1, wherein the light guide unit further includes:
a deposition surface provided at a corner portion of the light guide unit, at which two of the plurality of light output parts neighboring each other are connected to each other; and
a reflective material disposed on the corner portion of the light guide unit.

17. The LED module of claim 15, wherein:
the light input surface is divided into a plurality of light input parts corresponding to the plurality of light output parts, respectively, and
a width of each of the plurality of light input parts decreases as extending toward an end of a corresponding one of the plurality of light output parts.

18. An LED module comprising:
a cover part;
a board part disposed on a front side of the cover part;
a light emitting part disposed on a front side of the board part, electrically connected to the board part and configured to emit light through a side surface of the light emitting part; and
a panel part disposed on the front side of the board part and comprising a light guide unit, the light guide unit including:
a body part configured to receive the light emitted from the side surface of the light emitting part; and
a plurality of light output parts extending from and disposed radially with respect to the body part and configured to emit the light received at the body part to a front side of the panel part,
wherein the body part includes a light input surface configured to receive the light emitted from the light emitting part, and each of the plurality of light output parts includes a light output surface configured to output the light received at the light input surface, and
wherein the light input surface includes diffusion bosses disposed along a circumferential direction of the side surface of the light emitting part.

19. The LED module of claim 15, wherein each of the plurality of light output parts includes:
a reflective surface provided on a surface opposite to the light output surface and configured to reflect the light received at the light input surface, and
a reflective optic disposed on the reflective surface and having a fine boss shape.

* * * * *